(12) United States Patent
Lee et al.

(10) Patent No.: US 12,519,216 B2
(45) Date of Patent: Jan. 6, 2026

(54) ELECTRONIC DEVICE INCLUDING ANTENNA AND PRINTED CIRCUIT BOARD

(71) Applicant: Samsung Electronics Co., Ltd., Suwon-si (KR)

(72) Inventors: Hyungjoo Lee, Suwon-si (KR); Gyusub Kim, Suwon-si (KR); Hosaeng Kim, Suwon-si (KR); Jinwoo Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 654 days.

(21) Appl. No.: 17/879,549

(22) Filed: Aug. 2, 2022

(65) Prior Publication Data

US 2022/0376386 A1 Nov. 24, 2022

Related U.S. Application Data

(63) Continuation of application No. PCT/KR2021/018290, filed on Dec. 3, 2021.

(30) Foreign Application Priority Data

Dec. 4, 2020 (KR) ........................ 10-2020-0168763

(51) Int. Cl.
*H01Q 1/22* (2006.01)
*H01Q 1/38* (2006.01)
(Continued)

(52) U.S. Cl.
CPC ............. *H01Q 1/38* (2013.01); *H01Q 1/2283* (2013.01); *H01Q 1/48* (2013.01);
(Continued)

(58) Field of Classification Search
CPC ...... H01Q 1/243; H01Q 1/22; H01Q 1/38–48; H05K 1/14; H05K 2201/10098
See application file for complete search history.

(56) References Cited

U.S. PATENT DOCUMENTS 9,705,180 B2 7/2017 Darnell et al.
10,476,151 B2 11/2019 Seo et al.
(Continued)

FOREIGN PATENT DOCUMENTS

KR 10-2014-0139213 12/2014
KR 10-2016-0021732 2/2016
(Continued)

OTHER PUBLICATIONS

Extended European Search Report dated Mar. 15, 2024 issued in European Patent Application No. 21901094.9.
(Continued)

*Primary Examiner* — Hasan Islam
(74) *Attorney, Agent, or Firm* — Nixon & Vanderhye, P.C

(57) ABSTRACT

An electronic device of various embodiments of the present disclosure may include: a display, a side bezel including at least one conductive portion, and a printed circuit board disposed inside the side bezel. The printed circuit board may include an interposer, and a first printed circuit board and a second printed circuit board electrically connected through the interposer. The first printed circuit board may include a first fill-cut area, and the second printed circuit board may include a second fill-cut area corresponding to the first fill-cut area, and a ground or feeding unit comprising a conductive feed of an antenna using the conductive portion may be disposed in the first fill-cut area or the second fill-cut area.

19 Claims, 26 Drawing Sheets

(51) Int. Cl.
  *H01Q 1/48*   (2006.01)
  *H01Q 21/00*  (2006.01)
  *H04M 1/02*   (2006.01)
  *H05K 1/14*   (2006.01)
  *H05K 1/18*   (2006.01)

(52) U.S. Cl.
  CPC ...... *H01Q 21/0006* (2013.01); *H04M 1/0277* (2013.01); *H05K 1/144* (2013.01); *H05K 1/147* (2013.01); *H05K 1/18* (2013.01); *H05K 2201/09027* (2013.01); *H05K 2201/10098* (2013.01); *H05K 2201/10189* (2013.01); *H05K 2201/10378* (2013.01); *H05K 2201/2018* (2013.01)

(56) References Cited

U.S. PATENT DOCUMENTS

| | | |
|---|---|---|
| 10,547,101 B2 | 1/2020 | Hwang et al. |
| 10,674,607 B2 | 6/2020 | Park et al. |
| 11,233,312 B2 | 1/2022 | Kim et al. |
| 2016/0049720 A1 | 2/2016 | Hwang et al. |
| 2018/0277934 A1 | 9/2018 | Kim et al. |
| 2018/0288203 A1 | 10/2018 | Jeon et al. |
| 2019/0082536 A1* | 3/2019 | Park ................... H04M 1/0277 |
| 2020/0093040 A1 | 3/2020 | Yun et al. |
| 2020/0344869 A1 | 10/2020 | So et al. |
| 2021/0289622 A1 | 9/2021 | Hwangbo |
| 2022/0052437 A1 | 2/2022 | Lee et al. |
| 2022/0094073 A1 | 3/2022 | Park et al. |

FOREIGN PATENT DOCUMENTS

| | | |
|---|---|---|
| KR | 10-2018-0105356 | 9/2018 |
| KR | 10-2018-0109509 | 10/2018 |
| KR | 10-2019-0029215 | 3/2019 |
| KR | 10-2020-0034175 | 3/2020 |
| KR | 10-2020-0036460 | 4/2020 |
| KR | 10-2020-0069167 | 6/2020 |
| KR | 10-2020-0126124 | 11/2020 |

OTHER PUBLICATIONS

International Search Report for PCT/KR2021/018290 dated Mar. 28, 2022, 5 pages.
Written Opinion of the ISA for PCT/KR2021/018290 dated Mar. 28, 2022, 4 pages.
Korean Office Action issued Jan. 9, 2025 in corresponding Korean Patent Application No. 10-2020-0168763.
Korean Notice of Patent Grant dated Aug. 18, 2025 issued in Korean Patent Application No. 10-2020-0168763 and English translation, 4 pp.

* cited by examiner

ELECTRONIC DEVICE INCLUDING ANTENNA AND PRINTED CIRCUIT BOARD

CROSS-REFERENCE TO RELATED APPLICATIONS

This application is a continuation of International Application No. PCT/KR2021/018290 designating the United States, filed on Dec. 3, 2021, in the Korean Intellectual Property Receiving Office and claiming priority to Korean Patent Application No. 10-2020-0168763, filed on Dec. 4, 2020, in the Korean Intellectual Property Office, the disclosures of which are incorporated by reference herein in their entireties.

BACKGROUND

Field

The disclosure relates to an electronic device including an antenna and a printed circuit board.

Description of Related Art

An electronic device such as a mobile electronic device is seeking thinness, lightweight, miniaturization and/or multi-functionality, and for this, the electronic device may include a printed circuit board (e.g., a printed circuit board (PCB), a printed board assembly (PBA), a rigid-flexible PCB (RFPCB), and/or a flexible printed circuit board (FPCB), etc.) on which various components are disposed. The printed circuit board may include a circuit wiring which connects a plurality of electronic components disposed thereon. Recently, a composite printed circuit board laminating a plurality of printed circuit boards in a vertical direction, and disposing an interposer between the plurality of printed circuit boards to electrically connect the plurality of printed circuit boards is being applied.

In a situation where a multiple-input and multiple-output (MIMO) communication technology or a 5G sub-6 communication technology is applied, securing the number of antennas and an antenna bandwidth is becoming an important issue. The number of antennas and a radio frequency (RF) circuit for implementing an antenna supporting a MIMO or sub-6 band are increased, and owing to this, it may be difficult to arrange them all in a limited space of an electronic device.

An electronic device may include a printed circuit board, and components such as a battery or a speaker are disposed in an area where the printed circuit board is disposed. Owing to restrictions on the area of the printed circuit board, there may be difficulties in securing a space in which a wireless communication circuit and antenna components are disposed. When the antenna components are disposed on the printed circuit board, a fill-cut area may not be secured, so antenna performance may be deteriorated, and it may be difficult to dispose components for a sub6 NR (new radio) band on the printed circuit board.

SUMMARY

Embodiments of the disclosure provide an electronic device that may secure a space for arranging a fill-cut area of a printed circuit board and components for an antenna.

An electronic device according to various example embodiments of the present disclosure may include: a display, a side bezel including at least one conductive portion, and a printed circuit board disposed inside the side bezel. The printed circuit board may include an interposer, and a first printed circuit board and a second printed circuit board electrically connected through the interposer. The first printed circuit board may include a first fill-cut area, and the second printed circuit board may include a second fill-cut area corresponding to the first fill-cut area, and a ground or feeding unit including a conductive material of an antenna using the conductive portion may be disposed in the first fill-cut area or the second fill-cut area.

An electronic device according to various example embodiments may include: a metal frame including a plurality of conductive portions, a main printed circuit board disposed inside the metal frame, a sub printed circuit board spaced apart from the main printed circuit board, and a flexible circuit board electrically connecting the main printed circuit board and the sub printed circuit board. The sub printed circuit board may include a first interposer, and a first printed circuit board and a second printed circuit board electrically connected through the first interposer. The main printed circuit board may include a second interposer, and a third printed circuit board and a fourth printed circuit board electrically connected through the second interposer, and may connect a ground, and a feeding unit including a conductive material, of a plurality of antennas through at least one of the first printed circuit board and second printed circuit board of the sub printed circuit board. The first printed circuit board may include a first fill-cut area, and the second printed circuit board may include a second fill-cut area corresponding to the first fill-cut area. The ground or feeding unit of the plurality of antennas using the conductive portion may be disposed at the first fill-cut area or the second fill-cut area.

An electronic device according to various example embodiments of the present disclosure may secure an antenna fill-cut area by disposing a first printed circuit board and a second printed circuit board through an interposer, and improve antenna performance by spacing an antenna feeding unit and a ground from a display. For another example, the electronic device may improve an isolation between antennas by separating a plurality of antenna feeding structures into the first printed circuit board (e.g., an upper board) and the second printed circuit board (e.g., a lower board).

An electronic device according to various example embodiments of the present disclosure may secure a fill-cut area of a printed circuit board, and arrange components for an antenna.

In addition, various effects directly or indirectly identified through the present document may be provided.

BRIEF DESCRIPTION OF THE DRAWINGS

The above and other aspects, features and advantages of certain embodiments of the present disclosure will be more apparent from the following detailed description, taken in conjunction with the accompanying drawings, in which.

In relation with a description of the drawings, the same or similar reference numerals may be used for the same or similar elements.

DETAILED DESCRIPTION

Figure 1:
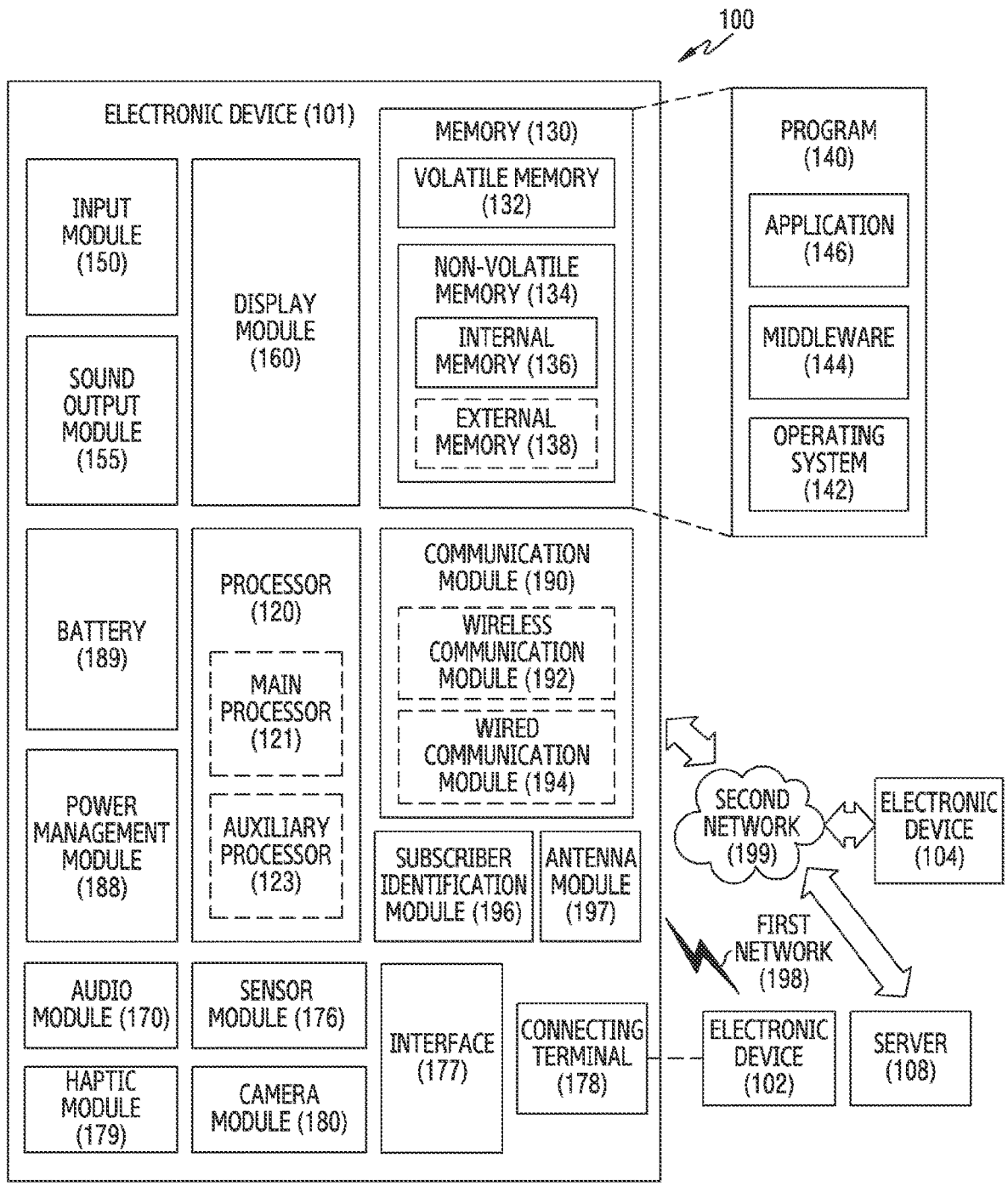
FIG. 1 is a block diagram illustrating an example electronic device in a network environment according to various embodiments.

Various example embodiments of the present disclosure are described in greater detail below with reference to the accompanying drawings. For convenience, sizes of elements shown in the drawings may be exaggerated or reduced, and the present disclosure is not necessarily limited as illustrated.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
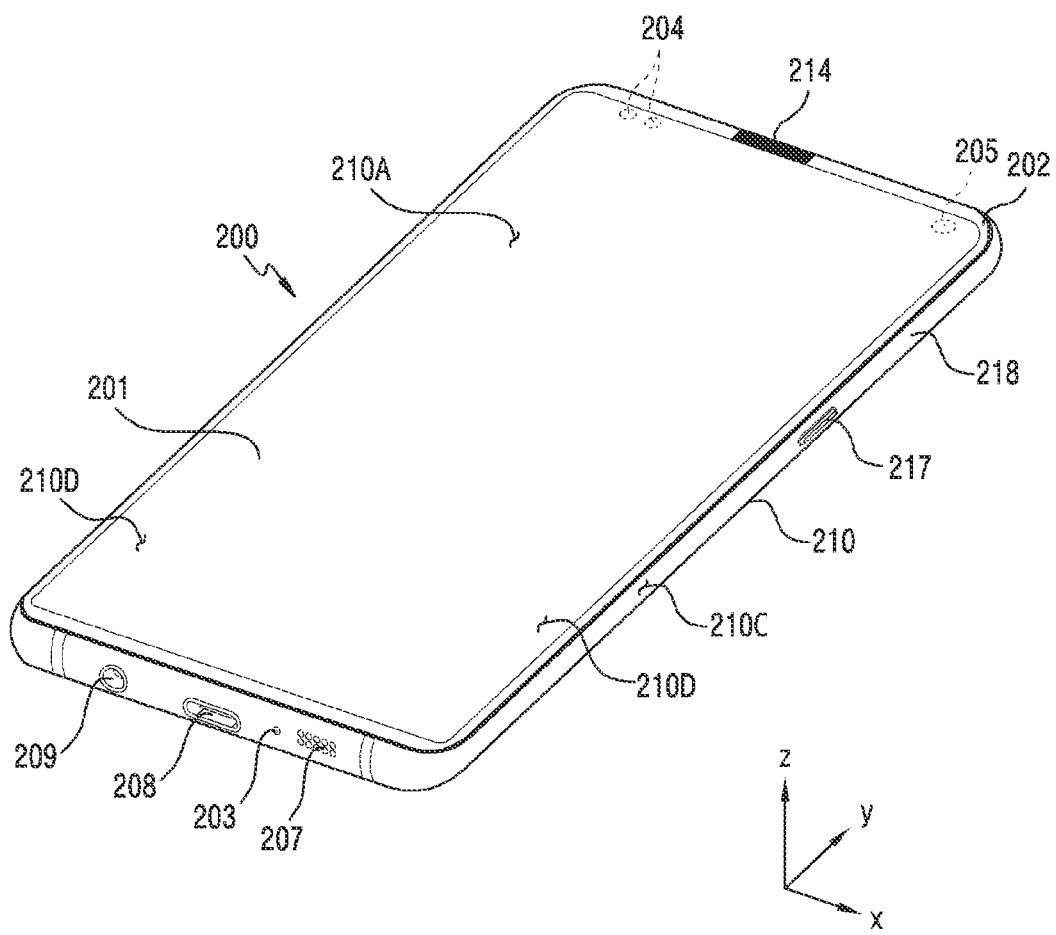
FIG. 2 is a front perspective view of an electronic device according to various embodiments.
Figure 3:
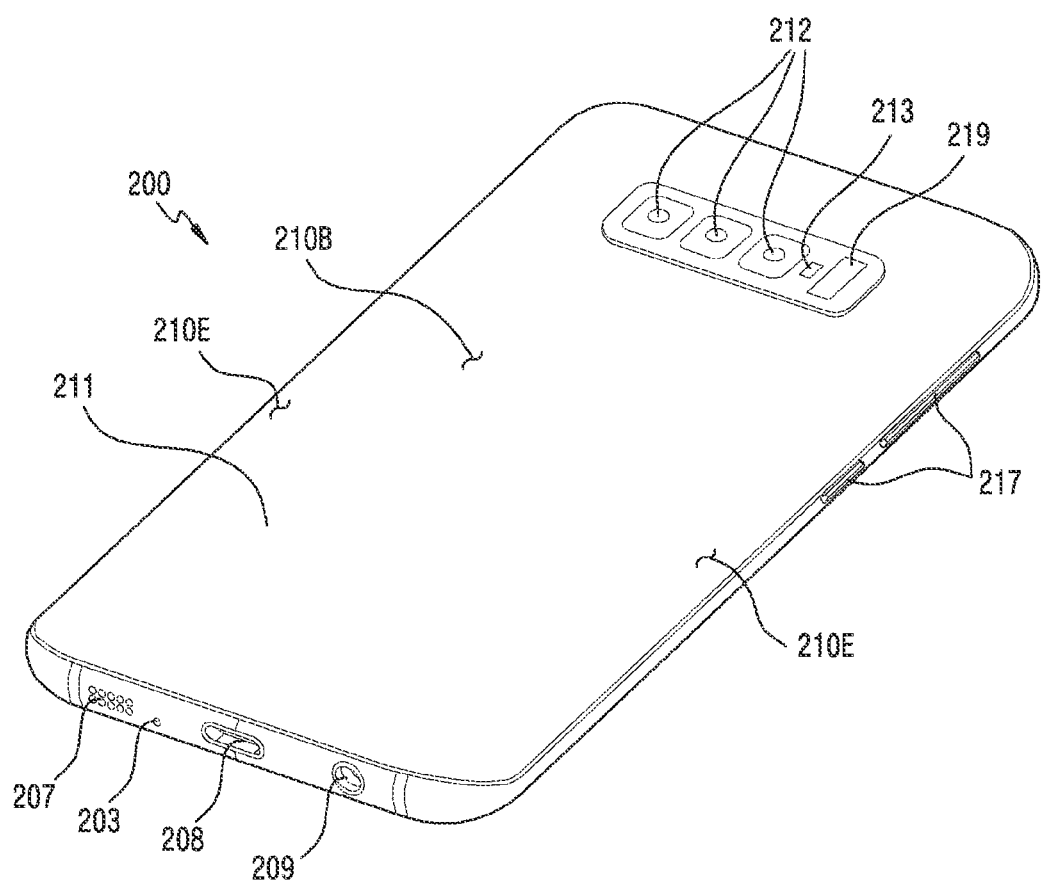
FIG. 3 is a rear perspective view of an electronic device according to various embodiments.

FIG. 2 is a front perspective view of an electronic device according to various embodiments. FIG. 3 is a rear perspective view of the electronic device according to various embodiments.

Referring to FIG. 2 and FIG. 3, the electronic device 200 (e.g., the electronic device 101 of FIG. 1) of an embodiment may include a housing 210 which includes a first surface (or a front surface) 210A, a second surface (or a rear surface) 210B, and a side surface 210C surrounding a space between the first surface 210A and the second surface 210B. In an embodiment (not shown), the housing may refer to a structure which forms some of the first surface 210A, the second surface 210B, and the side surface 210C.

According to an embodiment, the first surface 210A may be formed by a front plate 202 (e.g., a glass plate including various coating layers, or a polymer plate) at least a part of which is substantially transparent. The second surface 210B may be formed by a substantially opaque rear plate 211. The rear plate may be formed by, for example, coated or colored glass, ceramic, polymer, metal (e.g., aluminum, stainless steel (STS), or magnesium), or a combination of at least two of the above materials. The side surface 210C may be formed by a side bezel structure 218 (or "side member") coupled to the front plate 202 and the rear plate 211 and including a metal and/or a polymer. In some embodiment, the rear plate 211 and the side bezel structure 218 may be integrally formed and include the same material (e.g., a metal material such as aluminum).

In an illustrated embodiment, the front plate 202 may include, at both ends of a long edge of the front plate 202, two first areas 210D bending from the first surface 210A toward the rear plate 211 and extending seamlessly. In an illustrated embodiment (referring to FIG. 3), the rear plate 211 may include, at both ends of the long edge, two second areas 210E bending from the second surface 210B toward the front plate 202 and extending seamlessly. In some embodiment, the front plate 202 (or the rear plate 211) may include only one of the first areas 210D (or the second areas 210E). In some embodiment, some of the first areas 210D or the second areas 210E may not be included. In the above embodiments, when viewed from the side of the electronic device 200, the side bezel structure 218 may have a first thickness (or width) at a side surface not including the first areas 210D or the second areas 210E, and may have a second thickness thinner than the first thickness at a side surface including the first areas 210D or the second areas 210E.

According to an embodiment, the electronic device 200 may include at least one or more of a display 201 (e.g., the display module 160 of FIG. 1), an input device 203 (e.g., the input module 150 of FIG. 1), sound output devices 207 and 214 (e.g., the sound output module 155 of FIG. 1), sensor modules 204 and (e.g., the sensor module 176 of FIG. 1), camera modules 205, 212 and 213 (e.g., the camera module 180 of FIG. 1), a key input device 217, an indicator (not shown), and connectors 208 and 209. In some embodiment, the electronic device 200 may omit at least one (e.g., the key input device 217 or the indicator) of the elements or additionally include other elements.

The display 201 (e.g., the display module 160 of FIG. 1) may be visible through, for example, an upper portion of the front plate 202. In some embodiment, at least a part of the display 201 may be visible through the front plate 202 which forms the first surface 210A and the first area 210D of the side surface 210C. The display 201 may be coupled to or be disposed adjacent to a touch sensing circuit, a pressure sensor capable of measuring the intensity (pressure) of a touch, and/or a digitizer detecting a stylus pen of a magnetic field type. In some embodiment, at least a part of the sensor modules 204 and 219, and/or at least a part of the key input device 217 may be disposed at the first area 210D and/or the second area 210E.

In some embodiment (not shown), a rear surface of a screen display area of the display 201 may include at least one or more of the audio module 214, the sensor module 204, the camera module 205 (e.g., an image sensor), and a fingerprint sensor. In some embodiment (not shown), the display 201 may be coupled to or be disposed adjacent to the touch sensing circuit, the pressure sensor capable of measuring the intensity (pressure) of a touch, and/or a digitizer detecting a stylus pen of a magnetic field type. In some embodiment, at least a part of the sensor modules 204 and 219, and/or at least a part of the key input device 217 may be disposed at the first areas 210D and/or the second areas 210E.

The input device 203 may include a microphone. In some embodiment, the input device 203 may include a plurality of microphones which are disposed to be able to obtain the direction of sound. The sound output devices 207 and may include speakers. For example, the sound output devices 207 and 214 may include an external speaker 207 and a receiver 214 for a call. In some embodiment, the input device 203 (e.g., the microphone), the sound output device 207 or 214 and the connectors 208 and 209 may be disposed in the space of the electronic device 200, and may be exposed to the external environment through at least one hole formed in the housing 210. In some embodiment, the hole formed in the housing 210 may be commonly used for the input device 203 (e.g., the microphone) and the sound output devices 207 and 214. In some embodiment, the sound output devices 207 and 214 may include a speaker (e.g., a piezo speaker) which operates while the hole formed in the housing 210 is excluded.

The sensor modules 204 and 219 (e.g., the sensor module 176 of FIG. 1) may provide an electrical signal or data value which corresponds to an internal operating state of the electronic device 200 or an external environmental state. The sensor modules 204 and 219 may include, for example, a first sensor module (e.g., a proximity sensor), and/or a second sensor module (not shown) (e.g., a fingerprint sensor) disposed on the first surface 210A of the housing 210, and/or a third sensor module 219 (e.g., an HRM sensor) disposed on the second surface 210B of the housing 210. The fingerprint sensor may be disposed on the first surface 210A (e.g., the display 201) and/or the second surface 210B of the housing 210 as well. The electronic device 200 may further include a sensor module not shown, for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 205 and 212 include a first camera module 205 disposed on the first surface 210A of the electronic device 200, and a second camera module 212 disposed on the second surface 210B, and/or a flash 213. The camera modules 205 and 212 may include one or more lenses, an image sensor, and/or an image signal processor. The flash 213 may include, for example, a light emitting diode or a xenon lamp. The first camera module 205 may be disposed under a display panel in an under display camera (UDC) manner. In some embodiment, two or more lenses (wide-angle and telephoto lenses) and image sensors may be disposed on one surface of the electronic device 200. In some embodiment, the plurality of first camera modules 205 may be disposed on a first surface (e.g., a surface on which a screen is displayed) of the electronic device 200 in the under display camera (UDC) manner.

The key input device 217 may be disposed on the side surface 210C of the housing 210. In an embodiment, the electronic device 200 may not include some or all of the key input devices 217 mentioned above, and the key input device 217 not included may be implemented on the display 201 in another form such as a soft key, etc. In some embodiment, the key input device 217 may be implemented using a pressure sensor included in the display 201.

The indicator may be disposed, for example, on the first surface 210A of the housing 210. The indicator may present, for example, state information of the electronic device 200 in the form of light. In an embodiment, the indicator may present, for example, a light source interworking with an operation of the first camera module 205. The indicator may include, for example, an LED, an IR LED, and a xenon lamp.

The connectors 208 and 209 may include a first connector hole 208 capable of accommodating a connector (e.g., a USB connector) for transmitting and/or receiving power and/or data with an external electronic device, and/or a second connector hole 209 (or an earphone jack) capable of accommodating a connector for transmitting and/or receiving an audio signal with the external electronic device.

The first camera module 205 among the camera modules 205 and 212, the partial sensor module 204 among the sensor modules 204 and 219, or the indicator may be arranged to be visible through the display 201. The first camera module 205 may be disposed to overlap with a display area, and may also display a screen even in the display area corresponding to the first camera module 205. The first sensor module 204 may be disposed to perform its function without being visually exposed through the front plate 202 in the internal space of the electronic device.

Figure 4:
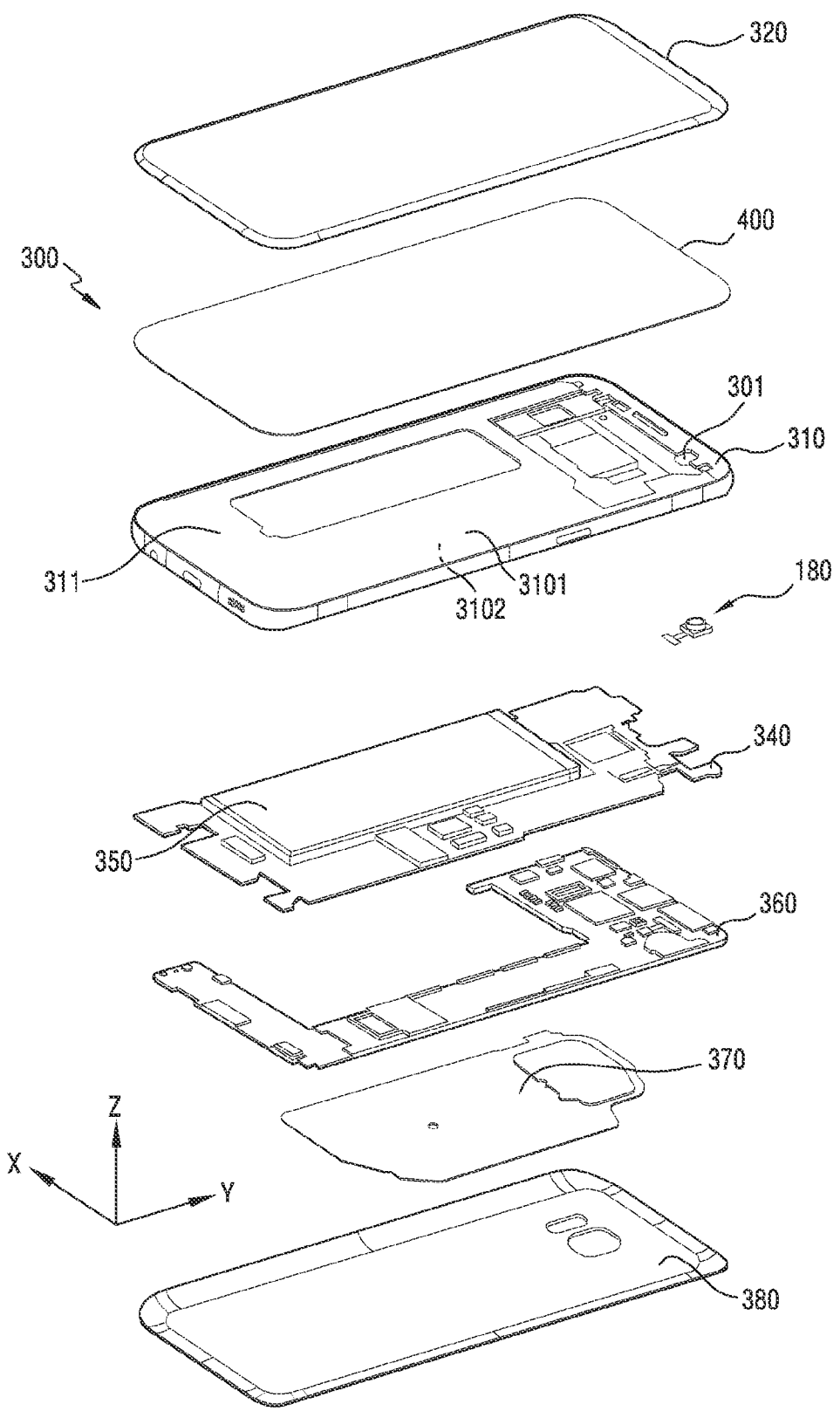
FIG. 4 is an exploded perspective view of an electronic device according to various embodiments.

FIG. 4 is an exploded perspective view of an electronic device according to various embodiments.

Referring to FIG. 4, according to various embodiments, the electronic device 300 (e.g., the electronic device 101 of FIG. 1 or the electronic device 200 of FIG. 2) may include a side member 310 (e.g., a side bezel structure), a first support member 311 (e.g., a bracket or support structure), a front plate 320 (e.g., a front cover), a display 400 (e.g., the display module 160 of FIG. 1 or the display of FIG. 2), a printed circuit board 340, a battery 350 (e.g., the battery 189 of FIG. 1), a second support member 360 (e.g., a rear case), an antenna 370 (e.g., the antenna module 197 of FIG. 1), and/or a rear plate 380 (e.g., a rear cover).

In some embodiment, the electronic device 300 may omit at least one (e.g., the first support member 311 or the second support member 360) of the elements or additionally include other elements. The at least one of the elements of the electronic device 300 may be the same as or be similar to at least one of the elements of the electronic device 101 of FIG. 1 or the electronic device 200 of FIG. 3, and a duplicated description is omitted below.

According to various embodiments, the first support member 311 may be disposed inside the electronic device 300 and be connected to the side member 310, or may be formed integrally with the side member 310. The first support member 311 may be formed of, for example, a metal material and/or a non-metal (e.g., polymer) material. The first support member 311 may be coupled at one surface to the display 330 and be coupled at the other surface to the printed circuit board 340. The printed circuit board 340 may be equipped with a processor, a memory, and/or an interface. The processor may include, for example, one or more of a central processing unit, an application processor, a graphics processing unit, an image signal processor, a sensor hub processor, or a communication processor.

According to an embodiment, the printed circuit board 340 may include a plurality of printed circuit boards (e.g., a first printed circuit board and a second printed circuit board) and at least one interposer. According to an embodiment, the plurality of printed circuit boards may be a printed circuit board formed of a material (e.g., FR4) having a non-bendable property, or a flexible printed circuit board (FPCB) having a bendable property (or a flexible property).

According to an embodiment, the printed circuit board 340 may include an area (e.g., a flexible area) (e.g., an FPCB or an RFPCB) having the bendable or flexible property. In an example, the flexible area may include a base film (or a substrate) and a copper clad layer. For example, the flexible area may be a flexible copper clad layer (FCCL) in which at least one copper clad is laminated on at least a part of at least one area of an upper end or lower end of a polyimide film.

According to an embodiment, a memory may include the volatile memory 132 of FIG. 1 or the non-volatile memory 134 of FIG. 1.

According to an embodiment, an interface may include a high definition multimedia interface (HDMI), a universal serial bus (USB) interface, an SD card interface, and/or an audio interface. The interface may, for example, electrically or physically connect the electronic device 300 to an external electronic device, and may include a USB connector, an SD card/MMC connector, or an audio connector.

According to an embodiment, the battery 350 (e.g., the battery 189 of FIG. 1) is a device for supplying power to at least one element of the electronic device 300, and may include, for example, a non-rechargeable primary battery, or a rechargeable secondary cell, or a fuel cell. At least a part of the battery 350 may be disposed, for example, on the substantially same plane as the printed circuit board 340. The battery 350 may be integrally disposed within the electronic device 300 as well. In an embodiment, the battery 350 may be disposed detachably from the electronic device 300 as well.

According to an embodiment, the antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may, for example, perform short-range communication with an external device, or wirelessly transmit and/or receive power required for charging. In an embodiment, an antenna structure may be formed by the side member 310 and/or a part of the first support member 311 or a combination thereof.

According to an embodiment, a shielding structure (not shown) (or a shield may) may be formed of a conductive material (e.g., a metal), and may be disposed on at least one area of the printed circuit board 340 and may electromagnetically shield a plurality of electronic components (e.g., a processor, a memory, an interface, a communication module, a sensor module, and/or a connection terminal) disposed on the printed circuit board 340.

According to various embodiments, the first support member 311 of the side member 310 may include a first surface 3101 facing the front plate 320 and a second surface 3102 facing an opposite direction (e.g., a rear plate direction) to the first surface 3101. According to some embodiment, the camera module 180 (e.g., the camera module 180 of FIG. 1) may be disposed between the first support member 311 and the rear plate 380. According to some embodiment, the camera module 180 may be disposed to be protruded or seen in the direction of the front plate 320 through a through-hole 301 which is connected from the first surface 3101 of the first support member 311 to the second surface 3102. According to some embodiment, a portion protruded through the through-hole of the camera module 180 may be disposed to detect the external environment in a corresponding position of the display 400.

Figure 5A:
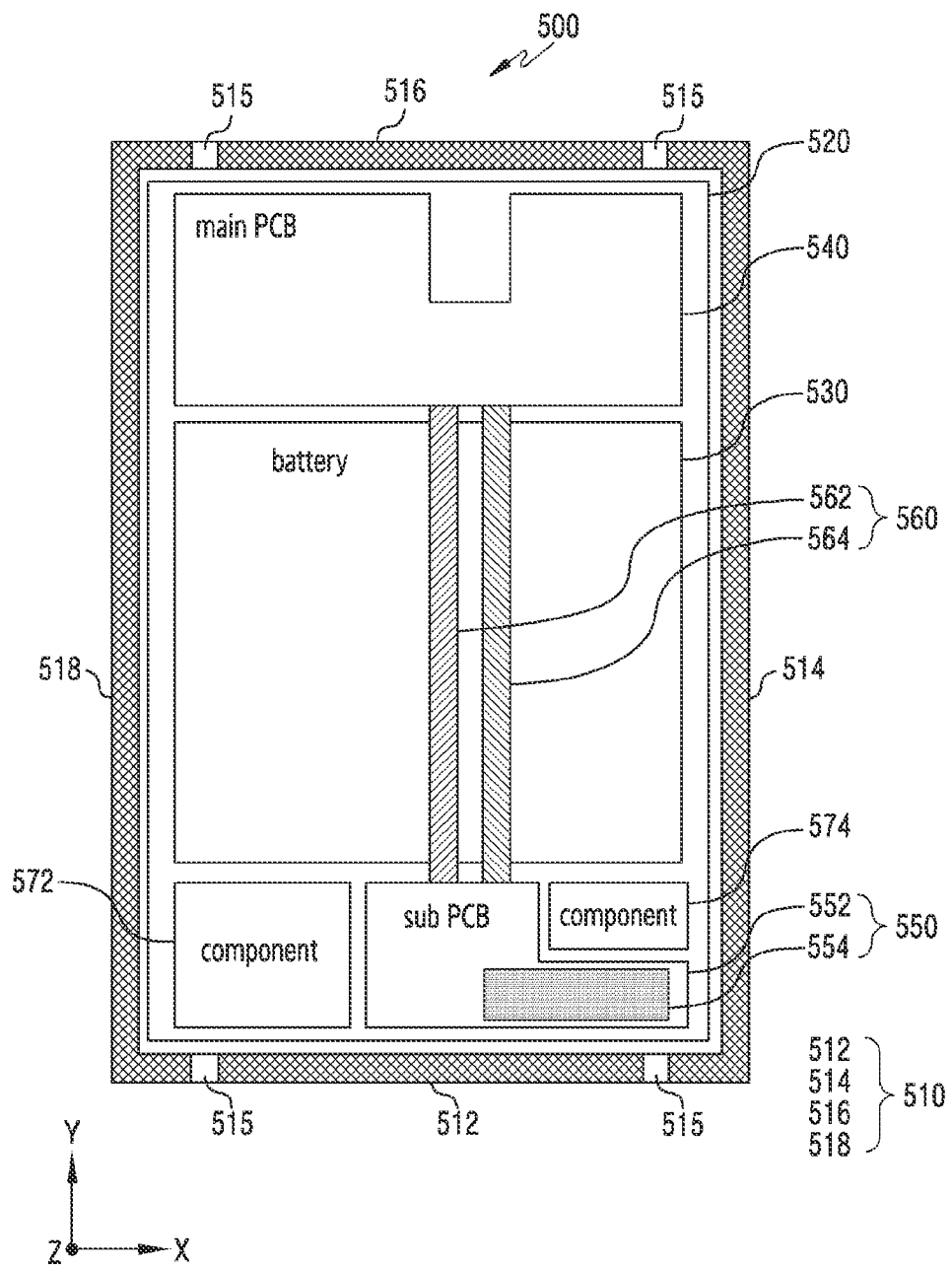
FIG. 5A is a diagram illustrating a main printed circuit board (main PCB), and a sub printed circuit board (sub PCB), of an electronic device according to various embodiments.

FIG. 5A is a diagram illustrating a main printed circuit board (main PCB) 540, and a sub printed circuit board (sub PCB) 550, of an electronic device 500 according to various embodiments.

Referring to FIG. 5A, the electronic device 500 of various embodiments of the present disclosure may include a side member 510 (e.g., the side member of FIG. 3), a display 520 (e.g., the display module 160 of FIG. 1, the display of FIG. 2, and/or the display 400 of FIG. 4), a battery 530 (e.g., the battery 189 of FIG. 1 and/or the battery 350 of FIG. 3), a main printed circuit board 540 (e.g., the printed circuit board 340 of FIG. 4), a sub printed circuit board 550 (e.g., the printed circuit board 340 of FIG. 4), a conductive line 560, and/or a plurality of electronic components 572 and 574. For another example, the electronic device 500 may include a processor (e.g., the processor 120 of FIG. 1), a communication module (e.g., the communication module 190 of FIG. 1), and a plurality of antenna modules (e.g., the antenna module 197 of FIG. 1). For example, the communication module (e.g., the communication module 190 of FIG. 1) may include a communication processor, a radio frequency IC (RFIC), and/or a radio frequency front end (RFFE).

According to an embodiment, the side member 510 may include a plurality of conductive portions 512, 514, 516 and 518 and at least one non-conductive portion 515. For example, the plurality of conductive portions 512, 514, 516 and 518 may be electrically separated by the at least one non-conductive portion 515.

According to an embodiment, the first conductive portion 512 may be positioned at a first side of the electronic device 500. At least a part of the second conductive portion 514 may be positioned at a second side of the electronic device 500. The third conductive portion 516 may be positioned at a third side of the electronic device 500. At least a part of the fourth conductive portion 518 may be positioned at a fourth side of the electronic device 500.

As an example, the first conductive portion 512 and the third conductive portion 516 may be disposed substantially in parallel with a criterion of an X-axis direction. The second conductive portion 514 and the fourth conductive portion may be disposed substantially in parallel with a criterion of a Y-axis direction. The at least one non-conductive portion 515 may be positioned between the first to fourth conductive portions 512, 514, 516 and 518.

As an example, the first conductive portion 512 may be positioned at a lower side of the electronic device 500 with a criterion of the Y-axis direction. The third conductive portion 516 may be positioned at an upper side of the electronic device 500 with a criterion of the Y-axis direction. At least a part of the second conductive portion 514 may be positioned in a first side part of the electronic device 500 with a criterion of the X-axis direction. At least a part of the fourth conductive portion 518 may be positioned in a second side part of the electronic device 500 with a criterion of the X-axis direction.

As an example, at least a part of the first conductive portion 512 may be used as a radiator of a first antenna of the electronic device 500. At least a part of the second conductive portion 514 may be used as a radiator of a second antenna of the electronic device 500. At least a part of the third conductive portion 516 may be used as a radiator of a third antenna of the electronic device 500. At least a part of the fourth conductive portion 518 may be used as a radiator of a fourth antenna of the electronic device 500.

According to an embodiment, the main printed circuit board 540 (e.g., the printed circuit board 340 of FIG. 4) may include a memory (e.g., the memory 130 of FIG. 1), a processor (e.g., the processor 120 of FIG. 1, an application processor, a communication processor), or an RFIC (e.g., the communication module 190 of FIG. 1).

According to an embodiment, the sub printed circuit board 550 (e.g., the printed circuit board 340 of FIG. 4) may dispose components such as an RFIC thereon.

Figure 5B:
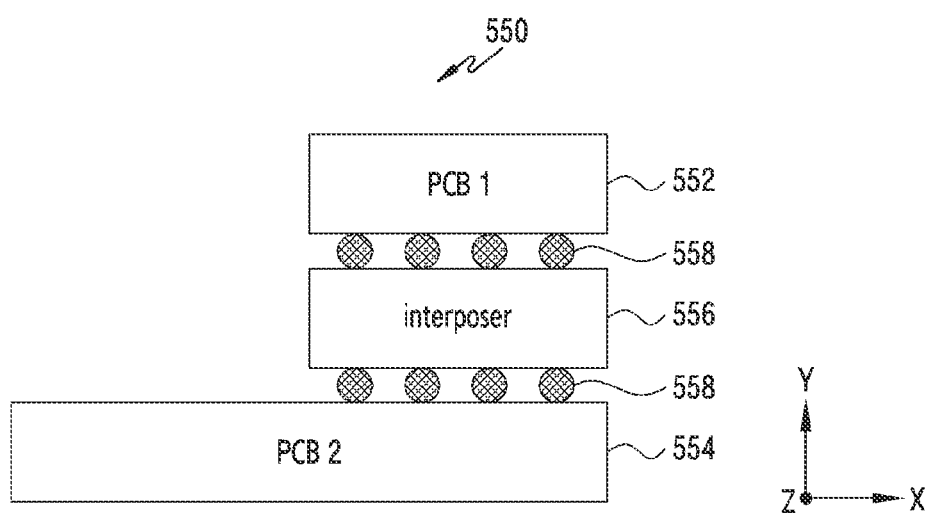
FIG. 5B is a diagram illustrating a cross-section of the sub printed circuit board shown in FIG. 5A according to various embodiments.

FIG. 5B is a diagram illustrating a cross-section of the sub printed circuit board 550 shown in FIG. 5A.

Referring to FIG. 5A and FIG. 5B, the sub printed circuit board 550 may include a first printed circuit board 552 including a plurality of layers, a second printed circuit board 554 including a plurality of layers, and an interposer 556. As another example, the sub printed circuit board 550 may be understood as a sub printed circuit board assembly (PBA), and the sub PBA may include a first printed circuit board, a second printed circuit board, and an interposer. The interposer 556 may be disposed between the first printed circuit board 552 and the second printed circuit board 554. A plurality of conductive members 558 (e.g., solder balls) may be disposed between the interposer 556 and the first printed circuit board 552 and between the interposer 556 and the second printed circuit board 554, and may electrically connect the first printed circuit board 552 and the second printed circuit board 554. For example, the sub printed circuit board 550 may be a composite printed circuit board to which a plurality of printed circuit boards are electrically connected using the interposer 556. For another example, the sub printed circuit board 550 may be a sub printed circuit board assembly (PBA).

According to an embodiment, the conductive line 560 may electrically connect the main printed circuit board 540 and the sub printed circuit board 550. For example, the conductive line 560 may include a first conductive line 562 or a second conductive line 564.

As an example, one side of the first conductive line 562 may be electrically connected to the main printed circuit board 540, and the other side of the first conductive line 562 may be electrically connected to the sub printed circuit board 550. As another example, the first conductive line 562 may include a flexible circuit board, a flexible printed circuit board radio frequency cable (FRC) or a coaxial cable, for transmitting a wireless signal between the main printed circuit board 540 and the sub printed circuit board 550.

As an example, one side of the second conductive line 564 may be electrically connected to the main printed circuit board 540, and the other side of the second conductive line 564 may be electrically connected to the sub printed circuit board 550. The second conductive line 564 may be a rigid-flexible PCB (RFPCB) or flexible printed circuit board (FPCB) for signal transmitting between the main printed circuit board 540 and the sub printed circuit board 550.

According to an embodiment, the plurality of electronic components 572 and 574 may be disposed adjacent to the sub printed circuit board 550. As an example, the plurality of electronic components 572 and 574 may include an audio module (e.g., the audio module 170 of FIG. 1), a speaker (e.g., the sound output module 155 of FIG. 1), a motor, a haptic module (e.g., the haptic module of FIG. 1), and/or a sensor module (e.g., the sensor module 176 of FIG. 1).

According to an embodiment, the display 520 may be disposed to face a front surface (e.g., a Z-axis direction of FIG. 2) of the electronic device 500, and the main printed circuit board 554 or the sub printed circuit board 550 may be positioned between the display 520 and a rear surface (e.g., the second surface (or rear surface) 210B of FIG. 2). The battery 530 may be positioned, for example, in a space between the main printed circuit board 554 and the sub printed circuit board 550.

Figure 6:
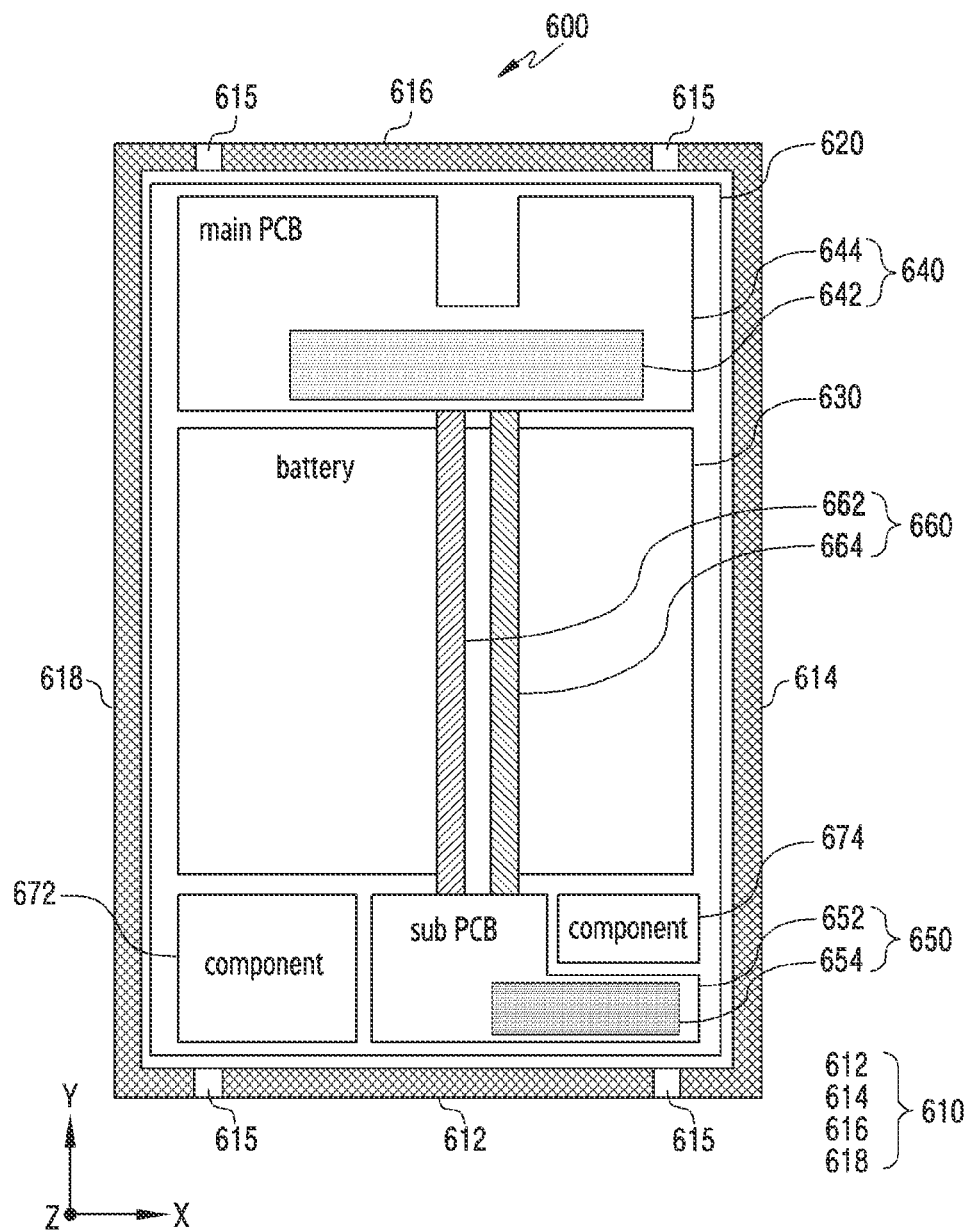
FIG. 6 is a diagram illustrating a main printed circuit board, and a sub printed circuit board, of an electronic device according to various embodiments.

FIG. 6 is a diagram illustrating a main printed circuit board 640, and a sub printed circuit board 650, of an electronic device 600 according to various embodiments. In describing FIG. 6, a detailed description of the same or similar construction illustrated in FIG. 5A may not be repeated.

Referring to FIG. 6, the electronic device 600 of various embodiments of the present disclosure may include a side member 610 (e.g., the side member 310 of FIG. 4), a display 620 (e.g., the display module 160 of FIG. 1, the display 201 of FIG. 2 and/or the display 400 of FIG. 4), a battery 630 (e.g., the battery 189 of FIG. 1 and/or the battery 350 of FIG. 3), a main printed circuit board 640 (e.g., the printed circuit board 340 of FIG. 4), a sub printed circuit board 650 (e.g., the printed circuit board 340 of FIG. 4), a conductive line 660, and/or a plurality of electronic components 672 and 674. As another example, the electronic device may include a processor (e.g., the processor 120 of FIG. 1), a communication module (e.g., the communication module 190 of FIG. 1), and a plurality of antenna modules (e.g., the antenna module 197 of FIG. 1).

According to an embodiment, the side member 610 may include a plurality of conductive portions 612, 614, 616, and 618 and at least one non-conductive portion 615. For example, the plurality of conductive portions 612, 614, 616, and 618 may be electrically separated by the at least one non-conductive portion 615.

According to an embodiment, the first conductive portion 612 may be positioned at a first side of the electronic device 600. The second conductive portion 614 may be positioned at a second side of the electronic device 600. The third conductive portion 616 may be positioned at a third side of the electronic device 600. The fourth conductive portion 618 may be positioned at a fourth side of the electronic device 600.

As an example, the first conductive portion 612 and the third conductive portion 616 may be disposed substantially in parallel with a criterion of an X-axis direction. The second conductive portion 614 and the fourth conductive portion may be disposed substantially in parallel with a criterion of a Y-axis direction. The at least one non-conductive portion 615 may be disposed between the first to fourth conductive portions 612, 614, 616, and 618.

As an example, the first conductive portion 612 may be positioned at a lower central part of the electronic device 600 with a criterion of the Y-axis direction. The third conductive portion 616 may be positioned at an upper central part of the electronic device 600 with a criterion of the Y-axis direction. At least a part of the second conductive portion 614 may be positioned in a first side part of the electronic device 600 with a criterion of the X-axis direction. At least a part of the fourth conductive portion 618 may be positioned in a second side part of the electronic device 600 with a criterion of the X-axis direction.

As an example, at least a part of the first conductive portion 612 may be used as a radiator of a first antenna of the electronic device 600. At least a part of the second conductive portion 614 may be used as a radiator of a second antenna of the electronic device 600. At least a part of the third conductive portion 616 may be used as a radiator of a third antenna of the electronic device 600. At least a part of the fourth conductive portion 618 may be used as a radiator of a fourth antenna of the electronic device 600.

According to an embodiment, the main printed circuit board 640 (e.g., the printed circuit board 340 of FIG. 4) may include a memory (e.g., the memory of FIG. 1), a processor (e.g., the processor 120 of FIG. 1, an application processor and/or a communication processor), or an RFIC (e.g., the communication module 190 of FIG. 1).

Figure 7A:
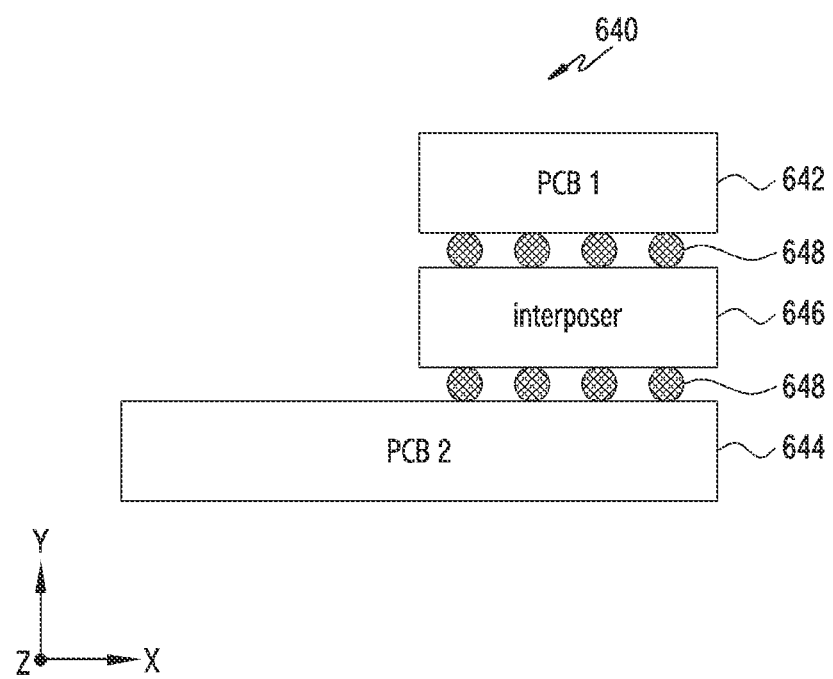
FIG. 7A is a diagram illustrating a cross-section of the main printed circuit board shown in FIG. 6 according to various embodiments.

FIG. 7A is a diagram illustrating a cross-section of the main printed circuit board 640 shown in FIG. 6 according to various embodiments.

Referring to FIG. 6 and FIG. 7A, the main printed circuit board 640 may include the first printed circuit board 642, the second printed circuit board 644, and an interposer 646. As another example, the main printed circuit board 640 may be referred to as a main printed circuit board assembly (PBA) 640, and the main PBA 640 may be understood as including the first printed circuit board 642, the second printed circuit board 644, and the interposer 646.

According to an embodiment, the interposer 646 may be disposed between the first printed circuit board 642 and the second printed circuit board 644. A plurality of conductive members 648 (e.g., solder balls) may be disposed between the interposer 646 and the first printed circuit board 642 and between the interposer 646 and the second printed circuit board 644, and may electrically connect the first printed circuit board 642 and the second printed circuit board 644. For example, the main printed circuit board 640 may be a composite printed circuit board to which a plurality of printed circuit boards are electrically connected using the interposer 646. As another example, the main printed circuit board 640 may be a main printed circuit board assembly (PBA).

According to an embodiment, the sub printed circuit board 650 (e.g., the printed circuit board 340 of FIG. 4) may include an antenna module or an RFIC.

Figure 7B:
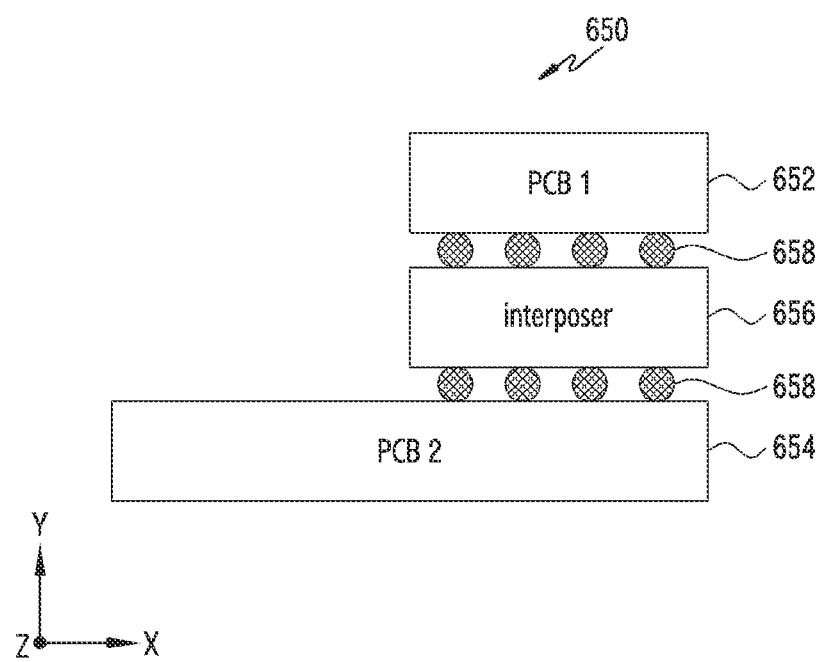
FIG. 7B is a diagram illustrating a cross-section of the sub printed circuit board shown in FIG. 6 according to various embodiments.

FIG. 7B is a diagram illustrating a cross-section of the sub printed circuit board shown in FIG. 6 according to various embodiments.

Referring to FIG. 6 and FIG. 7B, the sub printed circuit board 650 may include the first printed circuit board 652, the second printed circuit board 654, and an interposer 656. As another example, the sub printed circuit board 650 may be referred to as a sub printed circuit board assembly (PBA) 650, and the sub PBA 650 may be understood as including the first printed circuit board 652, the second printed circuit board 654, and the interposer 656. The interposer 656 may be disposed between the first printed circuit board 652 and the second printed circuit board 654. A plurality of conductive members 658 (e.g., solder balls) may be disposed between the interposer 656 and the first printed circuit board 652 and between the interposer 656 and the second printed circuit board 654, and may electrically connect the first printed circuit board 652 and the second printed circuit board 654. For example, the sub printed circuit board may be a composite printed circuit board in which a plurality of printed circuit boards are electrically connected using the interposer 656. For another example, the sub printed circuit board 640 may be a printed circuit board assembly (PBA).

According to an embodiment, the conductive line 660 may electrically connect the main printed circuit board 640 and the sub printed circuit board 650. For example, the conductive line 660 may include a plurality of conductive lines 662 and 664.

As an example, one side of the first conductive line 662 may be electrically connected to the main printed circuit board 640, and the other side of the first conductive line 662 may be electrically connected to the sub printed circuit board 650. For example, the first conductive line 662 may include a flexible RF cable (FRC), or a coaxial cable, for transmitting a wireless signal between the main printed circuit board 640 and the sub printed circuit board 650.

As an example, one side of the second conductive line 664 may be electrically connected to the main printed circuit board 640, and the other side of the second conductive line 664 may be electrically connected to the sub printed circuit board 650. The second conductive line 664 may include a rigid-flexible PCB (RFPCB) or flexible printed circuit board (FPCB) for signal transmitting between the main printed circuit board 640 and the sub printed circuit board 650.

Figure 8A:
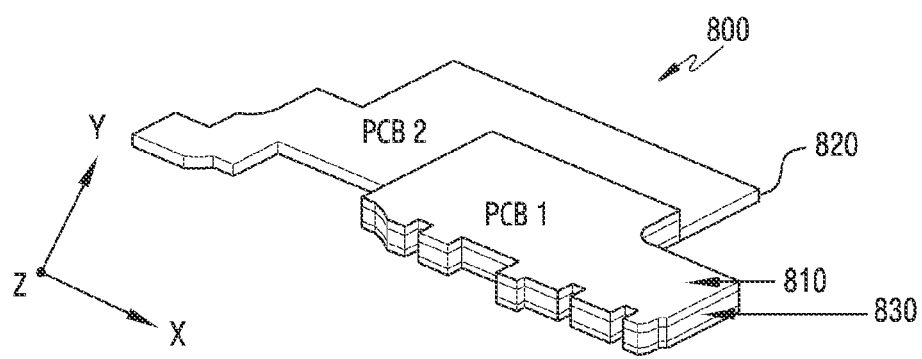
FIG. 8A is a perspective view illustrating the sub printed circuit board shown in FIG. 6 according to various embodiments.
Figure 8B:
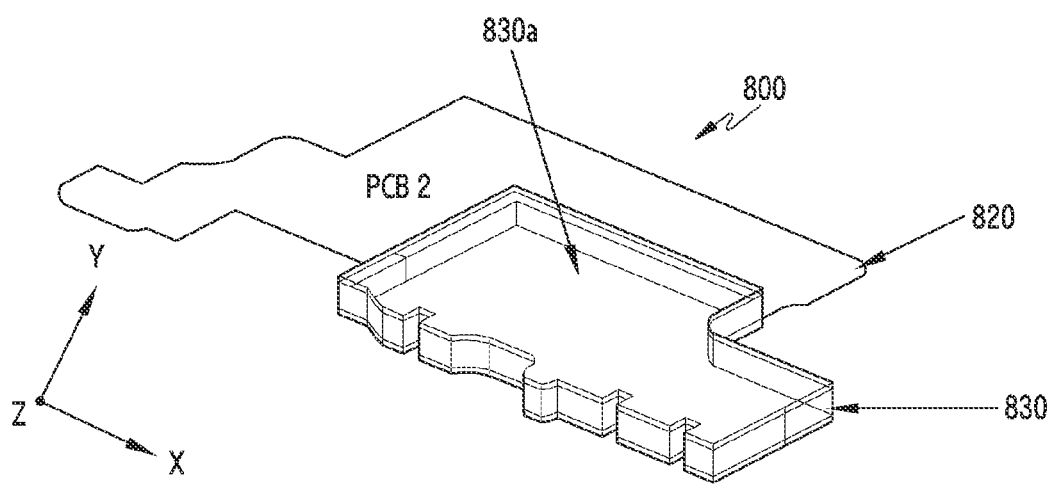
FIG. 8B is a perspective view illustrating an interposer of a sub printed circuit board according to various embodiments.
Figure 8C:
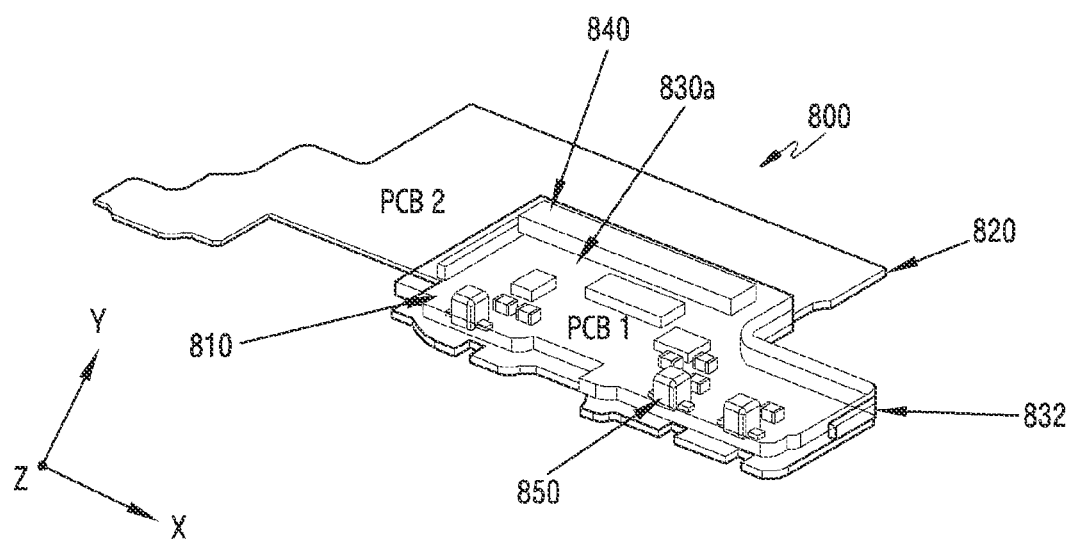
FIG. 8C is a perspective view illustrating an interposer of a sub printed circuit board according to various embodiments.

FIG. 8A is a perspective view illustrating a printed circuit board 800 according to various embodiments. FIG. 8B is a diagram illustrating an interposer 830 of the printed circuit board 800 according to various embodiments. FIG. 8C is a diagram illustrating an interposer 832 of the printed circuit board 800 according to various embodiments.

Referring to FIG. 8A, the printed circuit board 800 (e.g., the main printed circuit board 640 or the sub printed circuit board 650 of FIG. 6) may include a first printed circuit board 810 including a plurality of layers, a second printed circuit board 820 including a plurality of layers, and an interposer 830.

As an example, the interposer 830 may be disposed between the first printed circuit board 810 and the second printed circuit board 820. The first printed circuit board 810 may be disposed on the interposer 830, and the second printed circuit board 820 may be disposed beneath the interposer 830. However, the present disclosure is not limited to this, and the first printed circuit board 810 may be disposed beneath the interposer 830 and the second printed circuit board may be disposed on the interposer 830 as well. As an example, the second printed circuit board 820 may have a larger area than the first printed circuit board 810. Based on a vertical direction (e.g., a Z-axis direction), the first printed circuit board 810 may be positioned farther from a display (e.g., the display 400 of FIG. 4, the display 520 of FIG. 5A, and/or the display 620 of FIG. 6) than the second printed circuit board 820. For example, based on the vertical direction (e.g., the Z-axis direction), the second printed circuit board 820 may be positioned closer to the display (e.g., the display 400 of FIG. 4, the display 520 of FIG. 5A, and/or the display 620 of FIG. 6) than the first printed circuit board 810.

Referring to FIG. 8B, in an embodiment, an interposer 830 may be formed in the form of a closed curve or loop, and a specific space 830a may be provided inside the interposer 830. In an embodiment, electronic components (e.g., electronic components 850 of FIG. 8C) may be disposed in the specific space inside the interposer 830.

Referring to FIG. 8C, an interposer 832 may be formed in a curve form of being opened at one or two sides, and a specific space 830a may be provided inside the interposer 832. In an embodiment, the electronic components 850 and/or a cable connector 840 may be disposed in the specific space 830a inside the interposer 832.

Figure 9:
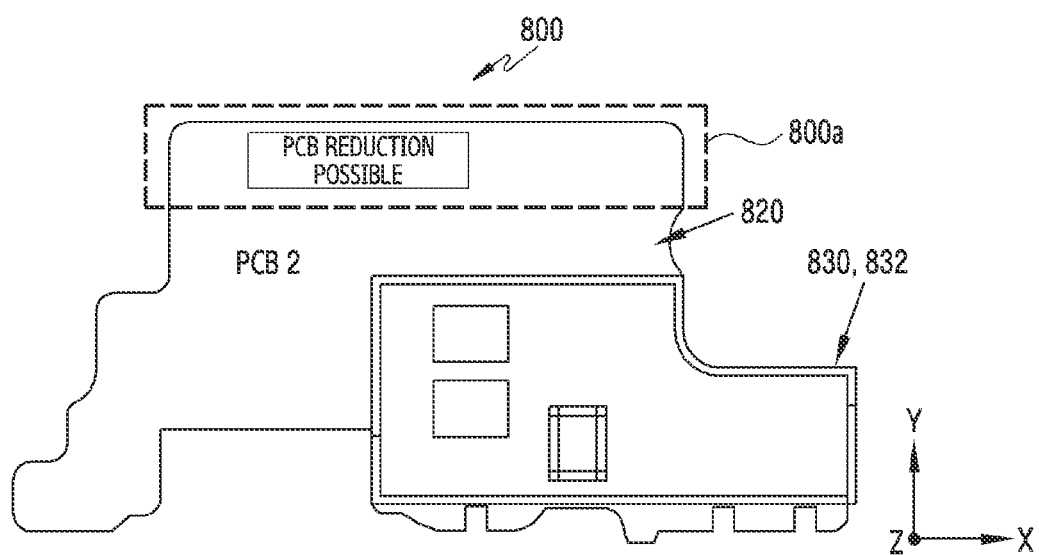
FIG. 9 is a diagram illustrating a reduced area of a second printed circuit board of a printed circuit board according to various embodiments.

FIG. 9 is a diagram illustrating a reduced area of the second printed circuit board 820 of the printed circuit board 800 according to various embodiments.

Referring to FIGS. 8A, 8B, 8C and 9, the printed circuit board 800 may be formed by disposing the second printed circuit board 820 under (e.g., a Z-axis direction) the first printed circuit board 810 and disposing the interposer 830 (e.g., the interposer 830 of FIG. 8A and/or the interposer 832 of FIG. 8C) between the first printed circuit board 810 and the second printed circuit boards 820. In an embodiment, the printed circuit board 800 may include a sub printed circuit board electrically connected to the main printed circuit board.

According to an embodiment, the printed circuit board 800 may reduce the size of the second printed circuit board 820 as the area of the first printed circuit board 810 is increased further to the area of the second printed circuit board 820. FIG. 9 shows that the area of the first printed circuit board 810 may be reduced according to the arrangement of the second printed circuit board 820 and, for example, the area of the second printed circuit board 820 may be reduced similarly to a first area 800a in FIG. 9. In an embodiment, when the size of the second printed circuit board 820 is reduced, an arrangement space for a battery (e.g., the battery 530 of FIG. 5A and/or the battery 630 of FIG. 6) may be additionally secured as well. In an embodiment, components such as a communication module, a digital IC, or an RF component, which were disposed at the reduced area of the second printed circuit board 820, may be disposed on the first printed circuit board 810.

Figure 10:
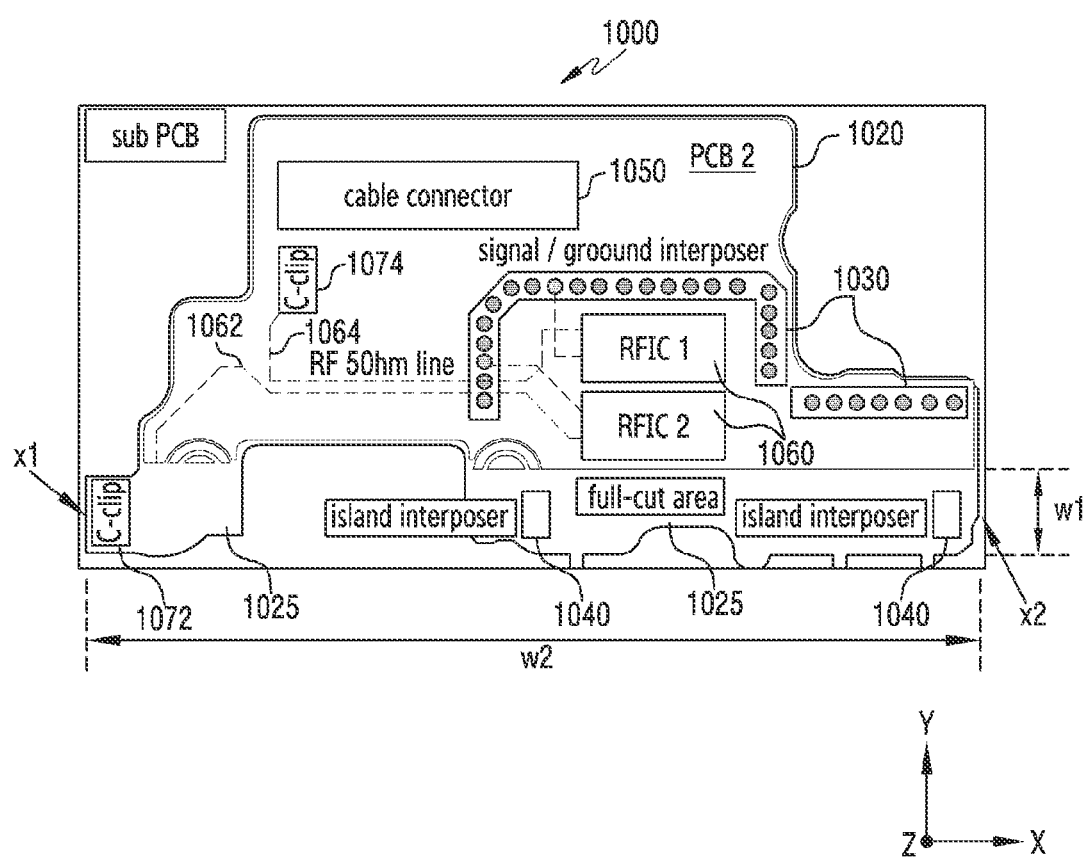
FIG. 10 is a diagram illustrating an example of a second printed circuit board (e.g., a second PCB) of a sub printed circuit board according to various embodiments.
Figure 11:
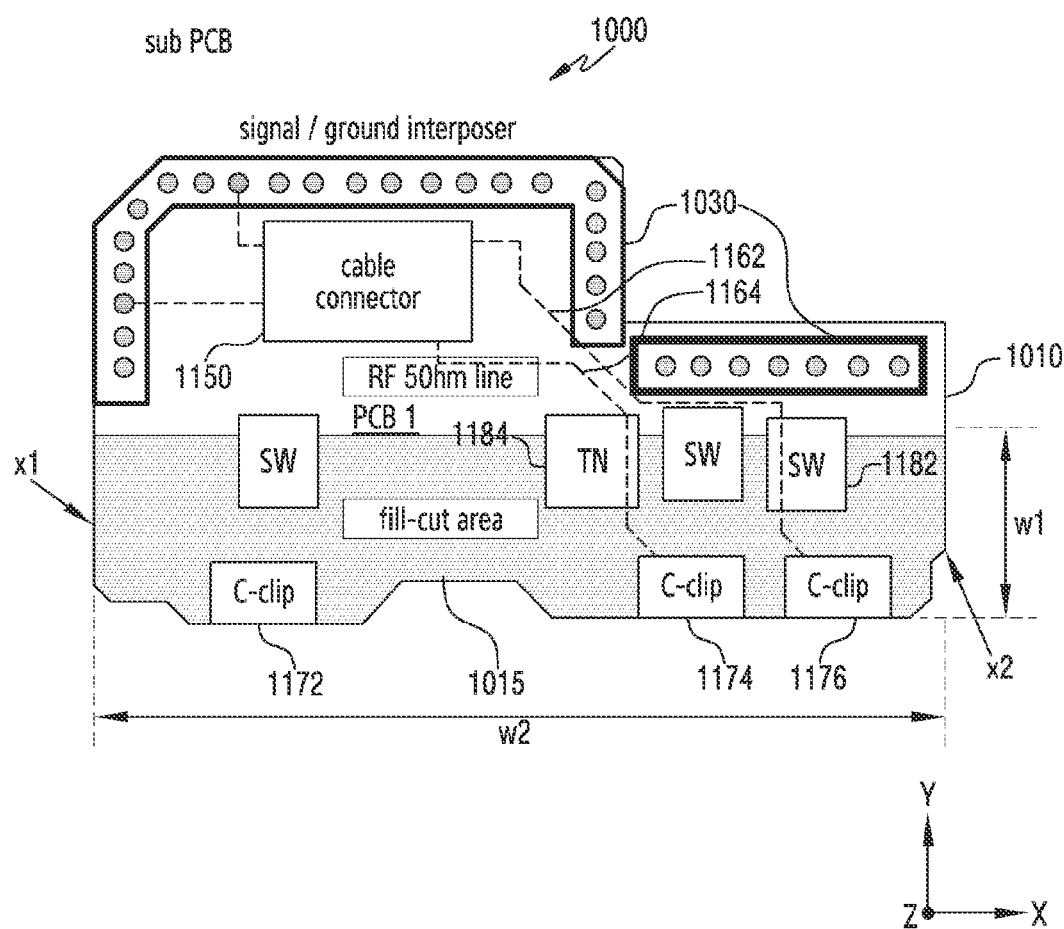
FIG. 11 is a diagram illustrating an example of a first printed circuit board (e.g., a first PCB) of a sub printed circuit board according to various embodiments.

FIG. 10 is a diagram illustrating an example of a second printed circuit board 1020 (e.g., a second PCB) of a printed circuit board 1000 according to various embodiments. FIG. 11 is a diagram illustrating an example of a first printed circuit board 1010 (e.g., a first PCB) of the printed circuit board 1000 according to various embodiments. In an embodiment, the printed circuit board may include a sub printed circuit board electrically connected to a main printed circuit board.

Referring to FIG. 6, FIG. 7A, FIG. 7B, FIG. 8A, FIG. 10 and FIG. 11, the printed circuit board 1000 (e.g., the sub printed circuit board 650 of FIG. 6) may include the first printed circuit board 1010 (e.g., the first PCB) (e.g., the first printed circuit board 652 of FIGS. 6 and 7B), the second printed circuit board 1020 (e.g., the second PCB) (e.g., the second printed circuit board 654 of FIGS. 6 and 7B), a first interposer 1030 (e.g., the interposer 656 of FIG. 7B), and/or a second interposer 1040. The first interposer 1030 and/or the second interposer 1040 may be disposed between the first printed circuit board 1010 and the second printed circuit board 1020, wherein the first printed circuit board 1010 and the second printed circuit board 1020 may be coupled. The first printed circuit board 1010 and the second printed circuit board 1020 may be electrically connected through the first interposer 1030.

According to an embodiment, the first printed circuit board 1010 may include a first fill-cut area 1015. For example, the first fill-cut area 1015 may be positioned in a portion adjacent to a first conductive portion (e.g., the first conductive portion 512 or 612 of FIG. 5A or FIG. 6) of a side member (e.g., the side member 510 or 610 of FIG. 5A or FIG. 6) used as a radiator of an antenna, when the first printed circuit board 1010 is disposed in an electronic device (e.g., the electronic device 200 of FIG. 2).

According to an embodiment, the second printed circuit board 1020 may include a second fill-cut area 1025. For example, the second fill-cut area 1025 may be positioned in a portion adjacent to the first conductive portion (e.g., the first conductive portion 512 or 612 of FIG. 5A or FIG. 6) of the side member (e.g., the side member 510 or 610 of FIG. 5A or FIG. 6) used as the antenna radiator.

According to an embodiment, the form and area of the first fill-cut area and the second fill-cut area 1025 may be the same or be similar. Since the second fill-cut area 1025 may affect antenna performance, the second fill-cut area may be formed to have a specific area. As an example, the second fill-cut area 1025 may be formed to have a first width (w1)

in a Y-axis direction and a second width (x2) from one side (x1) of the second printed circuit board 1020 to the other side (x2) in an X-axis direction.

According to an embodiment, when viewed in a Z-axis direction, at least a part of the first fill-cut area 1015 and the second fill-cut area 1025 may overlap.

As an example, the second interposer 1040 may be formed in an island form, and may be disposed between the first fill-cut area 1015 and the second fill-cut area 1025. For example, when viewed in the Z-axis direction, the second interposer 1040 may overlap with at least a part of the first fill-cut area and the second fill-cut area 1025. In an embodiment, the second interposer 1040 may be disposed in the plural.

As an example, the second interposer 1040 may increase a bonding force between the first printed circuit board 1010 and the second printed circuit board in the first fill-cut area 1015 and the second fill-cut area 1025, and increase a mechanical rigidity of the printed circuit board 1000. The second interposer may reduce, or prevent, a pushing and lifting error of the first printed circuit board 1010 and the second printed circuit board 1020 caused by a plurality of connection members 1172, 1174, and 1176. For example, the plurality of connection members 1172, 1174, and 1176 may include a first connection member 1172, a second connection member 1174, or a third connection member 1176.

As an example, a cable connector 1150, a plurality of switches 1182, a tuner 1184, the connection member 1172, and/or a plurality of RF lines 1162 and may be disposed on the first printed circuit board 1010. As an example, the connection member 1172 may electrically connect the first printed circuit board 1010 and a side member (e.g., the side member 510 of FIG. 5A and/or the side member 610 of FIG. 6). The first connection member 1172, the second connection member 1174, or the third connection member 1176 may be, for example, a C-clip, a spring, a screw, a conductive foam, or a conductive elastic member.

As an example, a cable connector 1050, a radio frequency integrated circuit (RFIC) 1060 (e.g., LTE RFIC and NR RFIC), and/or a plurality of RF lines 1062 and 1064 may be disposed on the second printed circuit board 1020. In an embodiment, the first interposer 1030 may be formed in the form of being opened at one or two sides, and a specific space may be prepared inside the first interposer 1030 For example, the RFIC 1060 (e.g., LTE RFIC and NR RFIC) may be disposed in the specific space inside the first interposer 1030 In an embodiment, a main printed circuit board (e.g., the main printed circuit board 640 of FIG. 6) and the printed circuit board 1000 may be connected by a plurality of conductive lines (e.g., the first conductive line 662 of FIG. 6 and/or the second conductive line 664 of FIG. 6). For example, an RF signal from the main printed circuit board (e.g., the main printed circuit board 640 of FIG. 6) may be transmitted to the printed circuit board 1000 through the first conductive line 662. For example, a first terminal of the first conductive line 662 may be electrically connected to the main printed circuit board (e.g., the main printed circuit board 640 of FIG. 6), and a second terminal may be electrically connected to the first printed circuit board 1010 of the printed circuit board 1000.

As an example, the second terminal of the first conductive line 662 may be connected to the cable connector 1150 of the first printed circuit board 1010. In order to reduce a loss of an RF signal transmitted from the main printed circuit board (e.g., the main printed circuit board 640 of FIG. 6), the RF signal may be transmitted to the first printed circuit board 1010 on which an antenna circuit is disposed.

As an example, the RF signal received by the first printed circuit board may be transmitted to at least one of the connection members 1174 and disposed on the first printed circuit board 1010 via the switch 1182 and/or tuner 1184 of the first printed circuit board 1010. At least one of the connection members 1174 and 1176 may be electrically connected to a side member (e.g., a side member 1640 of FIG. 16), wherein the RF signal may be forwarded to the side member.

As an example, a MIMO RF signal may be transmitted from the first printed circuit board 1010 to the second printed circuit board 1020 through the interposer 1030. The MIMO RF signal transmitted to the second printed circuit board 1020 may be transmitted to at least one of the connection members 1072 and 1074 disposed on the second printed circuit board 1020. The connection members 1072 and 1074 disposed on the second printed circuit board 1020 may be electrically connected to a side member (e.g., the side member 1640 of FIG. 16), wherein the MIMO RF signal may be transmitted to the side member. For example, the connection members 1072 and 1074 may include a fourth connection member 1072 and a fifth connection member 1074.

As an example, a first terminal of the second conductive line 664 may be electrically connected to the main printed circuit board (e.g., the main printed circuit board 640 of FIG. 6), and a second terminal may be electrically connected to the second printed circuit board 1020 of the printed circuit board 1000.

The second terminal of the second conductive line 664 may be connected to the cable connector 1050 of the second printed circuit board 1020. The RFIC (e.g., LTE RFIC and NR RFIC) and/or components disposed on the second printed circuit board 1020 may be controlled by a signal transmitted from the main printed circuit board (e.g., the main printed circuit board 640 of FIG. 6). Signals received by the second conductive line 664 may be transmitted to the first printed circuit board 1010 through the interposer 1030.

Figure 12:
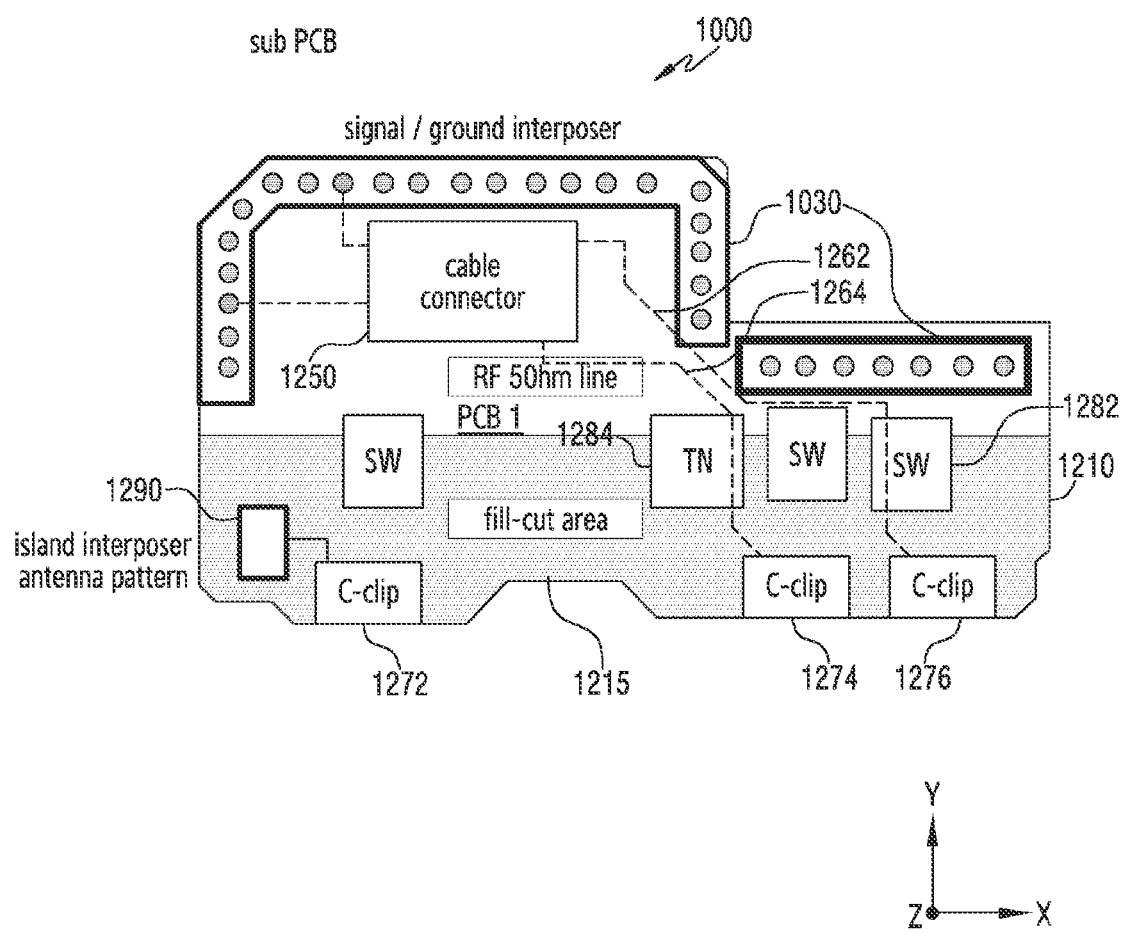
FIG. 12 is a diagram illustrating an antenna pattern of an island interposer scheme in a sub printed circuit board according to various embodiments.

FIG. 12 is a diagram illustrating a printed circuit board including an island interposer according to various embodiments.

Referring to FIG. 10 and FIG. 12, the printed circuit board 1000 (e.g., the sub printed circuit board 650 of FIG. 6) may include a first printed circuit board (e.g., a first PCB) (e.g., the first printed circuit board 652 of FIG. 6), a second printed circuit board 1020 (e.g., a second PCB) (e.g., the second printed circuit board 654 of FIG. 6), and the interposer 1030 (e.g., the interposer 656 of FIG. 7B). The first interposer 1030 may be disposed between the first printed circuit board 1210 and the second printed circuit board 1020 and thus, the first printed circuit board 1210 and the second printed circuit board 1020 may be coupled. The first printed circuit board 1210 and the second printed circuit board 1020 may be electrically connected through the first interposer 1030.

According to an embodiment, the first printed circuit board 1210 may include the first fill-cut area 1215. The first fill-cut area 1215 may be positioned in a portion adjacent to a first conductive portion (e.g., the first conductive portion 512 or 612 of FIG. 5A or FIG. 6) of a side member (e.g., the side members 510 and 610 of FIG. 5A or FIG. 6) which is used as a radiator of an antenna, when the first printed circuit board 1210 is disposed in an electronic device (e.g., the electronic device 200 of FIG. 2).

According to an embodiment, the second printed circuit board 1020 may include the second fill-cut area 1025. According to an embodiment, when viewed in the Z-axis direction, at least a part of the first fill-cut area 1215 and the second fill-cut area 1025 may be formed to overlap. The second fill-cut area 1025 may be positioned in a portion adjacent to a first conductive portion (e.g., the first conductive portion 512 or 612 of FIG. 5A or FIG. 6) of a metal frame (e.g., the metal frame 510 or 610 of FIG. 5A or FIG. 6).

According to an embodiment, the form and area of the first fill-cut area 1215 and the second fill-cut area 1025 may be the same or similar.

As an example, a cable connector 1250, a plurality of switches 1282, a tuner 1284, a plurality of connection members 1272, 1274 and 1276, and/or a plurality of RF lines 1262 and 1264 may be disposed on the first printed circuit board 1210.

As an example, the plurality of connection members 1272, 1274 and may electrically connect the first printed circuit board 1010 and a side member (e.g., the side member 510 of FIG. 5A or the side member 610 of FIG. 6). For example, the plurality of connection members 1272, 1274 and 1276 may include a C-clip, a spring, a screw, a conductive foam or a conductive elastic member.

As an example, the cable connector 1050, the RFIC 1060 (e.g., LTE RFIC or NR RFIC), and the plurality of RF lines 1062 and 1064 may be disposed on the second printed circuit board 1020. The first interposer 1030, for example, may be formed in the form of being opened at one or two sides, and a specific space may be prepared inside the first interposer 1030. For example, the RFIC (e.g., LTE RFIC and NR RFIC) may be disposed in the specific space inside the first interposer 1030

As an example, an antenna pattern 1290 may be disposed in the fill-cut area 1215 of the first printed circuit board 1210. The antenna pattern 1290 may be formed as an island-shaped interposer, and the antenna pattern 1290 may be electrically connected to the first connection member 1272 (e.g., a C-clip). The first connection member 1272 (e.g., the C-clip) may be connected to a side member (e.g., the side member 610 of FIG. 6) and thus, an RF signal may be transmitted to the side member. The antenna pattern 1290 formed as the island interposer may be used as a part of an antenna radiator of an electronic device.

As above, the antenna pattern 1290 may be formed as the island-shaped interposer in the second fill-cut area 1025 of the first printed circuit board 1010 (e.g., a lower board) of the sub printed circuit board 1000 and thus, the number of antennas disposed in the electronic device may be increased.

Figure 13:
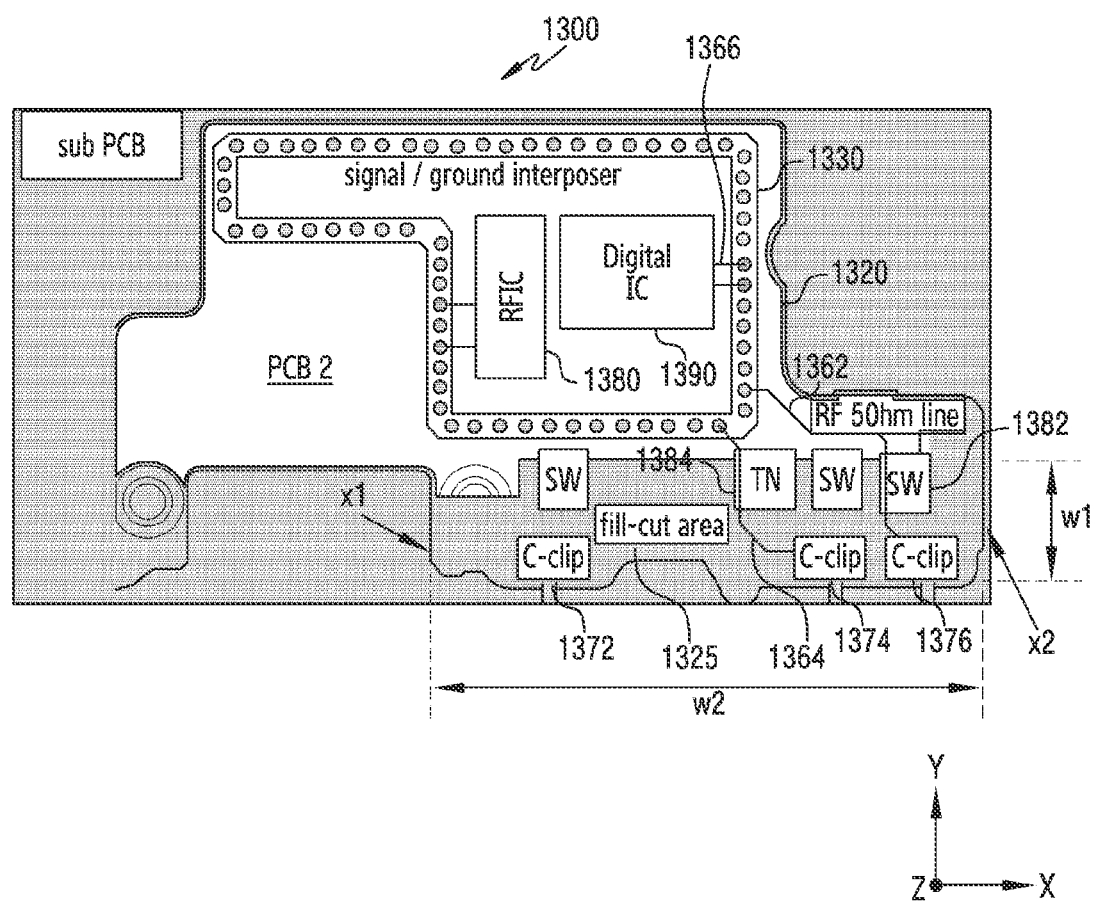
FIG. 13 is a diagram illustrating an example of a second PCB of a sub printed circuit board according to various embodiments.
Figure 14:
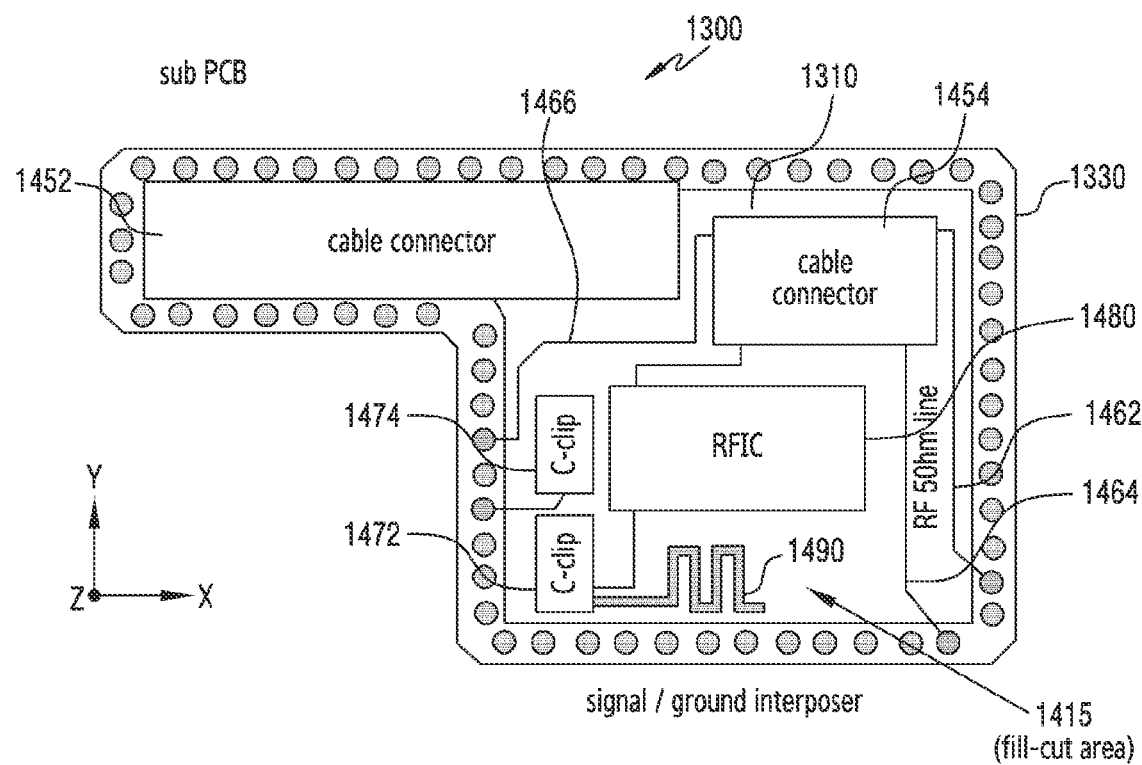
FIG. 14 is a diagram illustrating an example of a first PCB of a sub printed circuit board according to various embodiments.

FIG. 13 is a diagram illustrating an example of a second PCB of a printed circuit board according to various embodiments. FIG. 14 is a diagram illustrating an example of a first PCB of a sub printed circuit board according to various embodiments.

Referring to FIG. 13 and FIG. 14, the printed circuit board 1300 (e.g., the sub printed circuit board 650 of FIG. 6) may include a first printed circuit board (e.g., a first PCB) (e.g., the first printed circuit board 652 of FIGS. 6 and 7B), a second printed circuit board 1320 (e.g., a second PCB) (e.g., the second printed circuit board 654 of FIGS. 6 and 7B), and an interposer 1330 (e.g., the interposer of FIG. 7B). The interposer 1330 may be disposed between the first printed circuit board 1310 and the second printed circuit board 1320 and thus, the first printed circuit board 1310 and the second printed circuit board 1320 may be coupled. The first printed circuit board 1310 and the second printed circuit board 1320 may be electrically connected through the interposer 1330.

As an example, a first cable connector 1452, a second cable connector 1454, an RFIC 1480, a plurality of connection members 1472 and 1474 (e.g., C-clips), a plurality of RF lines 1462 and 1464, a plurality of signal lines 1466, and/or an antenna pattern 1490 may be disposed on the first printed circuit board 1310. In an embodiment, the antenna pattern 1490 may be positioned in a first fill-cut area 1415. As another example, the antenna pattern 1490 may be used for an NR band.

As an example, a flexible circuit board (e.g., the first conductive line 662 of FIG. 6) for transmitting an RF signal of the RFIC 1380 (e.g., LTE RFIC and/or NR RFIC) may be connected to the first cable connector 1452. A flexible circuit board (e.g., the second conductive line 664 of FIG. 6) for signal transmission of the digital IC 1390 may be connected to the second cable connector 1454.

As an example, the antenna pattern 1490 may be electrically connected to the first connection member 1742, and the first connection member 1472 may be electrically connected to the interposer 1330. The antenna pattern 1490 may be formed of a conductive metal material on the first printed circuit board 1310. In an embodiment, the antenna pattern 1490 may be electrically connected to a laser direct structuring (LDS) antenna pattern of an electronic device, or a conductive portion included in a side member.

As an example, the RFIC 1380 (e.g., LTE RFIC or NR RFIC), the digital IC 1390, a plurality of RF lines 1362 and 1364, a plurality of signal lines 1366, and/or a plurality of connection members 1372, 1374 and 1376 (e.g., C-clips) may be disposed on the second printed circuit board 1320.

As an example, the interposer 1330 may be formed in the form of a closed curve, and a specific space may be prepared inside the interposer 1330. For example, the RFIC 1380 (e.g., LTE RFIC or NR RFIC) and the digital IC may be disposed in the specific space inside the interposer 1330.

As an example, the RFIC 1380 (e.g., LTE RFIC and/or NR RFIC) may be electrically connected to the interposer 1330 via the RF lines 1362 and 1364. The digital IC 1390 may be electrically connected to the interposer 1330 through the signal line 1366. The plurality of connection members 1372, 1374 and 1376 (e.g., C-clips) may be electrically connected to the side member (e.g., the side member 610 of FIG. 6).

As an example, the second printed circuit board 1320 may include a second fill-cut area 1325. The second fill-cut area 1325 may be positioned in a portion adjacent to a first conductive portion (e.g., the first conductive portion 512 or 612 of FIG. 5A or FIG. 6) of a side member (e.g., the side member 510 or of FIG. 5A or FIG. 6) which is used as an antenna radiator.

As an example, the second fill-cut area 1325 may affect antenna performance and thus, may be formed to have a specified area. As an example, the second fill-cut area 1325 may be formed to have a first width (w1) in a Y-axis direction, and a second width (w2) from one side (x1) of the second printed circuit board 1020 to the other side (x2) in an X-axis direction. According to an embodiment, when viewed in a Z-axis direction, at least a part of the first fill-cut area 1015 and the second fill-cut area 1025 may overlap.

As an example, the plurality of connection members 1372, 1374 and (e.g., C-clips) and side member (e.g., the side member 1640 of FIG. 16) disposed on the second printed circuit board 1320 of the printed circuit board may be electrically connected. For example, an antenna feeding unit may be formed on the second printed circuit board 1320. As another example, the antenna pattern 1490 may be formed in the fill-cut area 1415 of the first printed circuit board 1310 and thus, the number of antennas disposed in an electronic device may be increased.

Figure 15A:
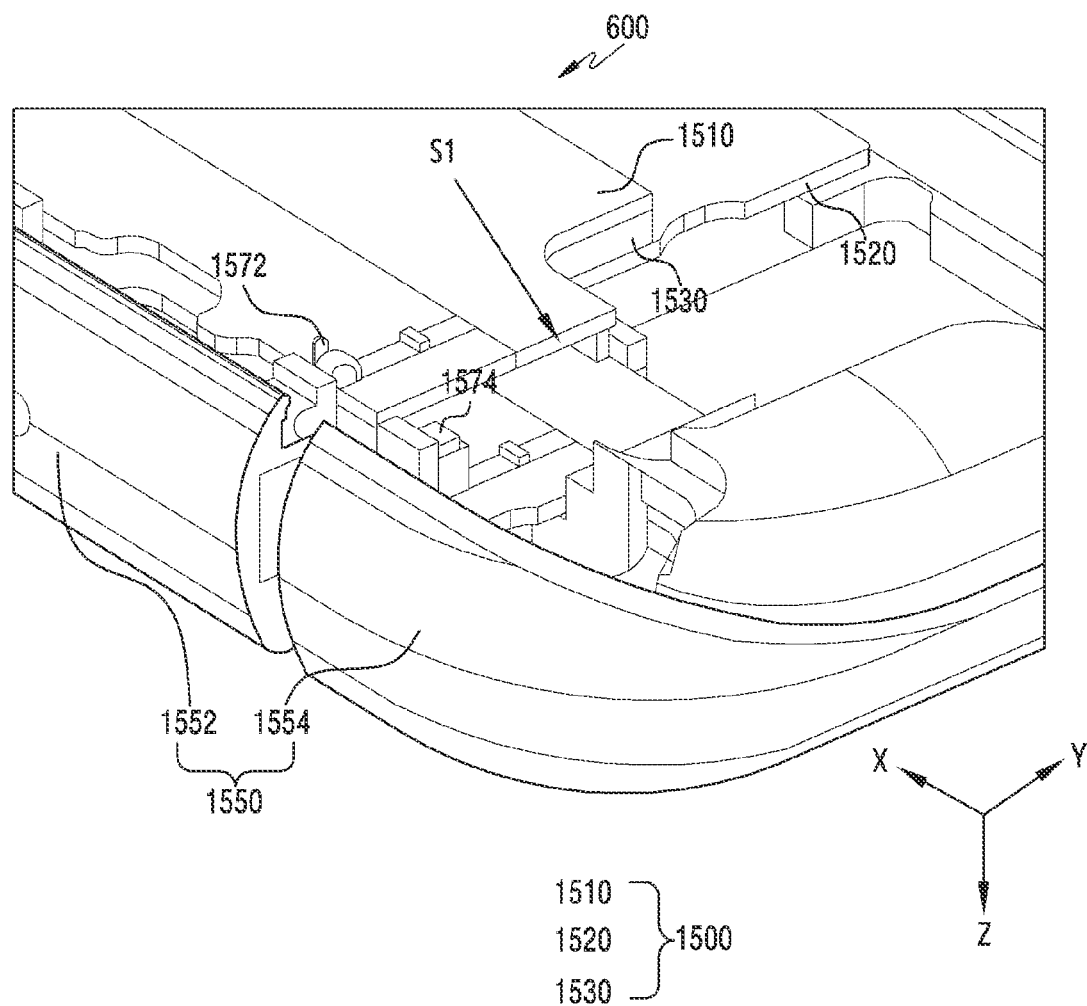
FIG. 15A is a partial perspective sectional view illustrating an antenna having improved interference using a sub printed circuit board according to various embodiments.

FIG. 15A is a partial perspective sectional view illustrating a first structure of a printed circuit board according to various embodiments.

Referring to FIG. 15A, the electronic device 600 may include a printed circuit board 1500, a plurality of connection members 1572 and 1574 (e.g., C-clips), and/or a side member 1550.

According to an embodiment, the printed circuit board 1500 may include a first printed circuit board 1510, a second printed circuit board 1520, and an interposer 1530. The first printed circuit board 1510 and the second printed circuit board 1520 may be coupled through the interposer 1530. For example, the first printed circuit board 1510 may be positioned on (e.g., a −Z-axis direction) the interposer 1530, and the second printed circuit board 1520 may be positioned beneath (e.g., a +Z-axis direction) the interposer 1530.

According to an embodiment, the interposer 1530 may be formed wherein one side (S1) of the printed circuit board 1500 is opened. The first connection member 1572 disposed on the first printed circuit board 1510 may be electrically connected to a first conductive portion 1552 of the side member 1550. The second connection member 1574 disposed on the second printed circuit board 1520 may be electrically connected to a second conductive portion 1554 of the side member 1550. For example, a wireless communication circuit (e.g., the RFIC 1380 of FIG. 13) may feed to a first antenna including the first conductive portion 1552 through the first connection member 1572, and may feed to a second antenna including the second conductive portion 1554 through the second connection member 1574.

Figure 15B:
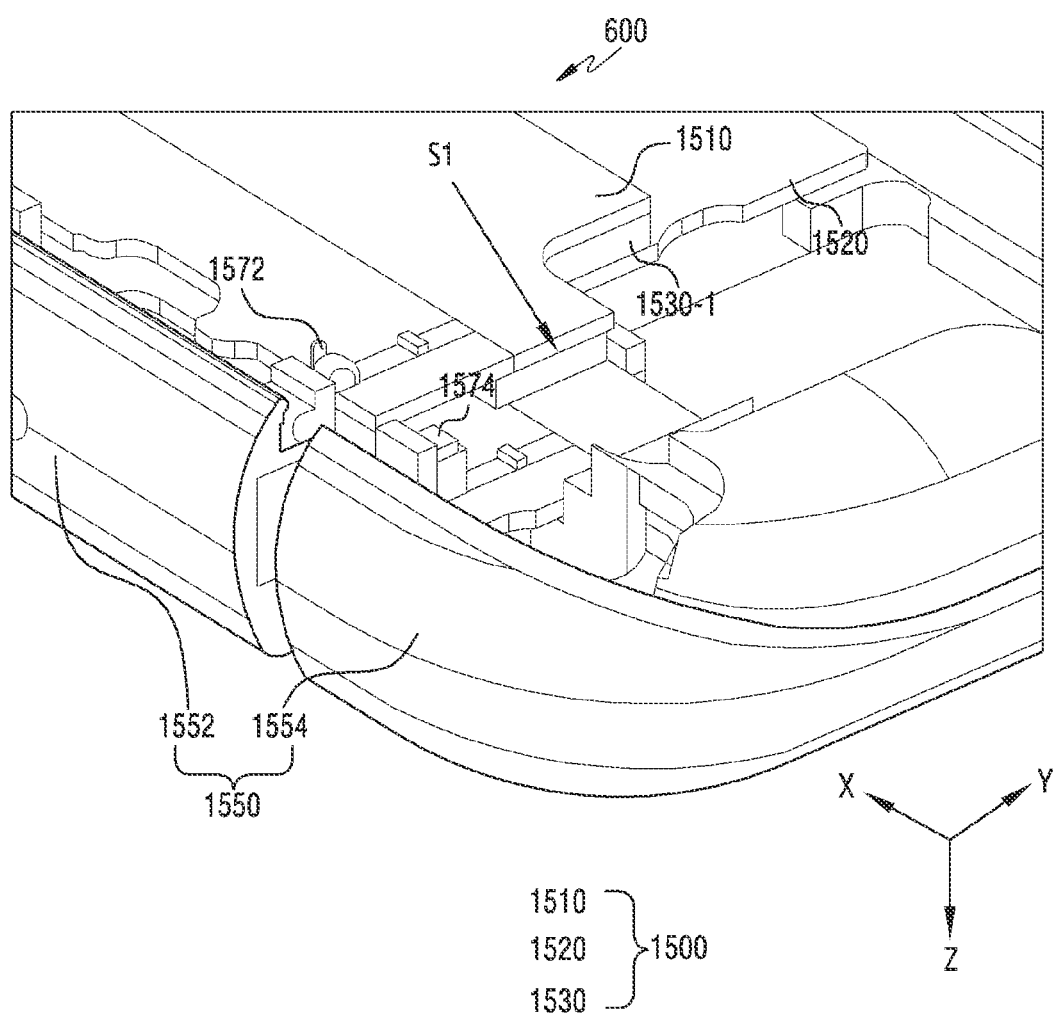
FIG. 15B is a partial perspective sectional view illustrating an antenna having improved interference using a sub printed circuit board according to various embodiments.

FIG. 15B is a partial perspective sectional view illustrating a second structure of a printed circuit board according to various embodiments.

Referring to FIG. 15B, the electronic device 600 may include a printed circuit board 1500, a plurality of connection members 1572 and 1574, and/or a side member 1550.

According to an embodiment, the printed circuit board 1500 may include a first printed circuit board 1510, a second printed circuit board 1520, and an interposer 1530-1. The first printed circuit board 1510 and the second printed circuit board 1520 may be coupled through the interposer 1530-1. For example, the first printed circuit board 1510 may be positioned on (e.g., a −Z-axis direction) the interposer 1530-1, and the second printed circuit board 1520 may be positioned beneath (e.g., a +Z-axis direction) the interposer 1530-1.

According to an embodiment, the interposer 1530-1 may be formed up to one side (S1) of the printed circuit board 1500. The first connection member disposed on the first printed circuit board 1510 may be electrically connected to a first conductive portion 1552 of the side member 1550. The second connection member 1574 disposed on the second printed circuit board may be electrically connected to a second conductive portion 1554 of the side member 1550. For example, a wireless communication circuit (e.g., the RFIC 1380 of FIG. 13) may feed to a first antenna including the first conductive portion 1552 through the first connection member 1572, and may feed to a second antenna including the second conductive portion 1554 through the second connection member 1574.

Figure 18:
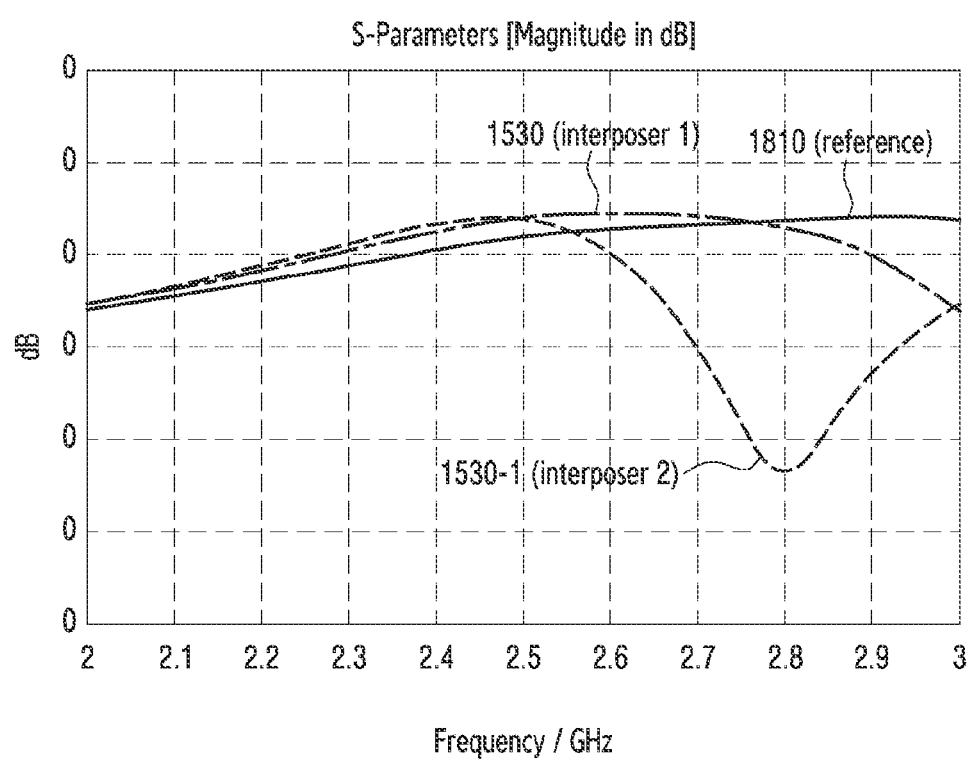
FIG. 18 is a graph illustrating that isolation between a plurality of antennas is improved using a sub printed circuit board according to various embodiments.

FIG. 18 is a graph illustrating that isolation between a plurality of antennas is improved using a sub printed circuit board according to various embodiments.

In an embodiment, the first structure (e.g., FIG. 15A) of the printed circuit board 1500 may be a structure in which the interposer 1530 is not formed at one side (S1), and the second structure (e.g., FIG. 15B) of the printed circuit board 1500 may be a structure in which the interposer 1530-1 is formed.

Referring to FIG. 18, in case of the second structure in which the interposer 1530-1 is formed up to one side (S1) of the printed circuit board 1500, it may be checked that interference between antennas is decreased at a band of 2 GHz to 2.5 GHz and thus an efficiency is improved, compared to a conventional technology (1810) and the first structure of FIG. 15A.

Figure 16:
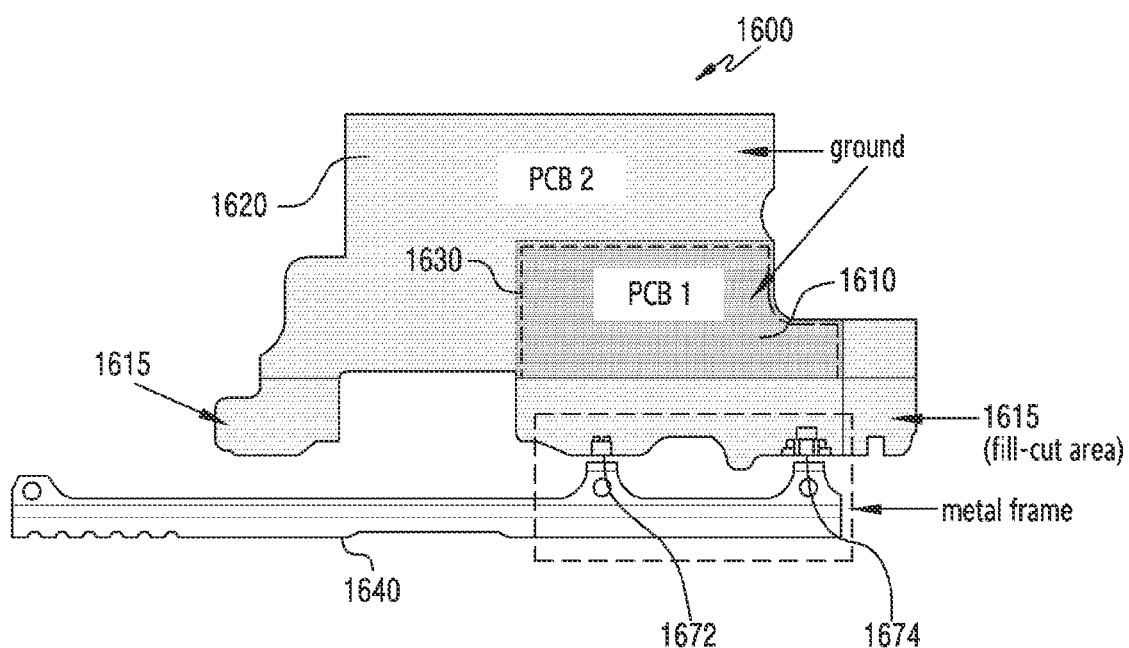
FIG. 16 is a diagram illustrating an example of a structure in which a sub printed circuit board and a metal frame are electrically connected for antenna feeding according to various embodiments.

FIG. 16 is a diagram illustrating an example of a structure in which a printed circuit board and a side member are electrically connected for antenna feeding.

Referring to FIG. 16, the printed circuit board 1600 may include a first printed circuit board 1610, a second printed circuit board 1620, an interposer 1630, or a plurality of connection members 1672 and 1674. The first printed circuit board 1610 may include a first fill-cut area 1615. The plurality of connection members 1672 and 1674 may be positioned in the fill-cut area 1615. A second fill-cut area (not shown) that is the same as or similar to the first fill-cut area 1615 may be formed in the second printed circuit board 1620. An electronic device may connect the ground of an antenna to the first connection member 1672, and connect the antenna feeding to the second connection member 1674. For example, the first connection member 1672 may be included in a ground, and the second connection member 1674 may be included in a feeding unit.

According to an embodiment, the antenna may include at least a part of the side member 1640, the ground including the first connection member 1672, or the feeding unit including the second connection member 1674.

According to an embodiment, the side member 1640 may include at least one protrusion that may be electrically connected to the first connection member or the second connection member 1674. The side member 1640 may include a conductive portion (e.g., the first conductive portion 512 of FIG. 5A).

Figure 17A:
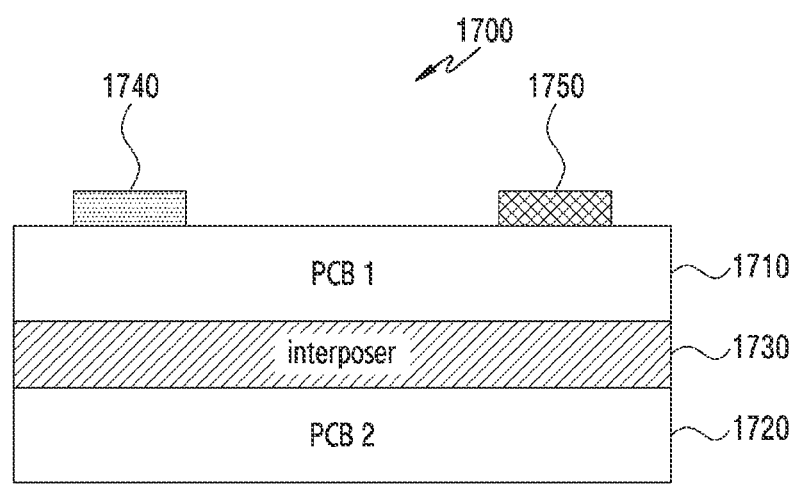
FIG. 17A is a diagram illustrating various examples of antenna feeding of a first PCB, and a second PCB, of a sub printed circuit board according to various embodiments.

FIG. 17A is a diagram illustrating various examples of a feeding unit and ground of a printed circuit board according to various embodiments.

Figure 17B:
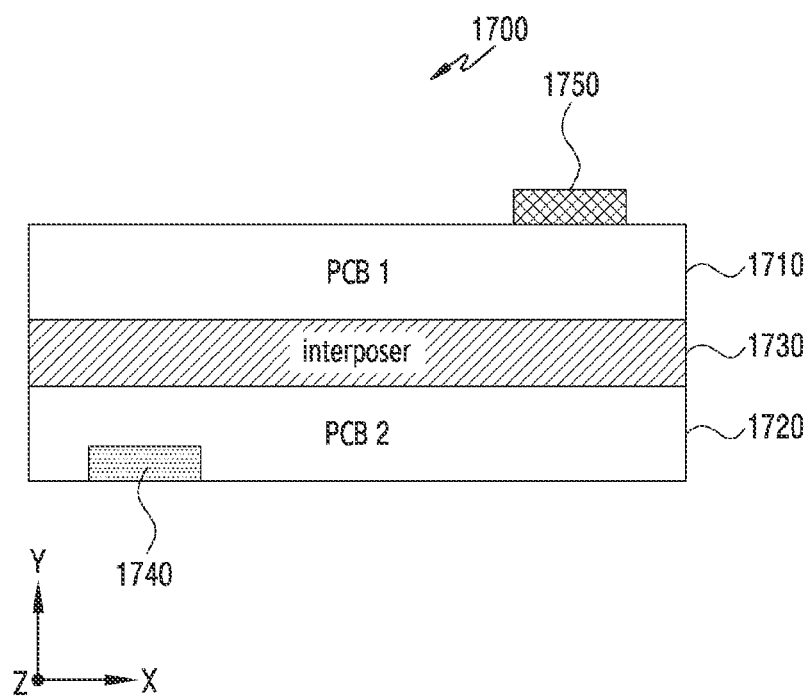
FIG. 17B is a diagram illustrating various examples of antenna feeding of a first PCB, and a second PCB, of a sub printed circuit board according to various embodiments.

FIG. 17B is a diagram illustrating various examples of a feeding unit and ground of the printed circuit board according to various embodiments.

Figure 17C:
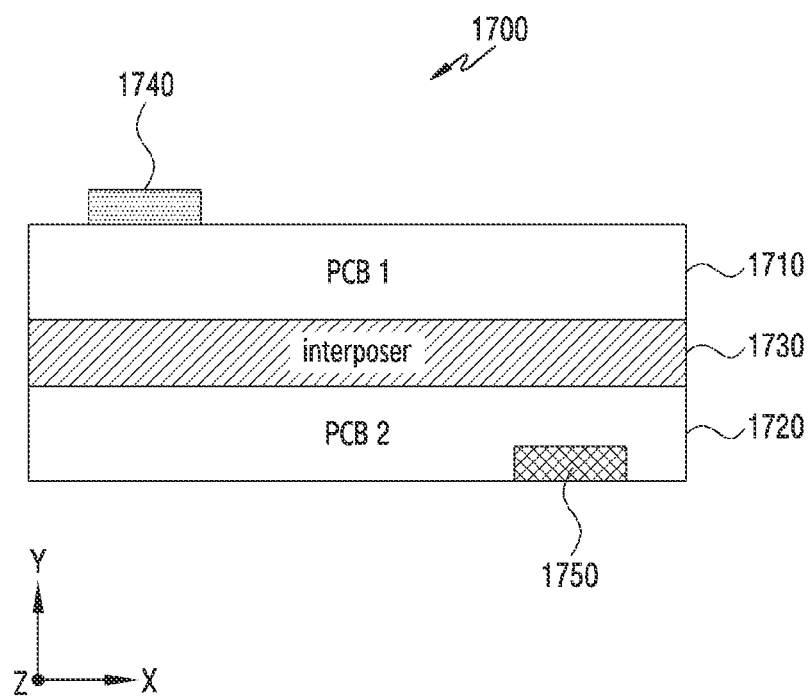
FIG. 17C is a diagram illustrating various examples of antenna feeding of a first PCB, and a second PCB, of a sub printed circuit board according to various embodiments.

FIG. 17C is a diagram illustrating various examples of a feeding unit and ground of the printed circuit board according to various embodiments.

Figure 17D:
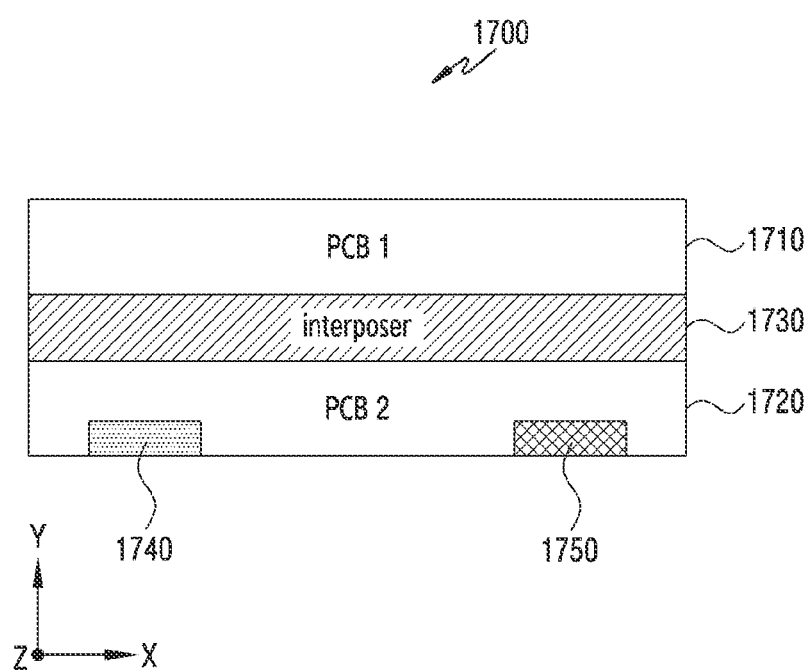
FIG. 17D is a diagram illustrating various examples of antenna feeding of a first PCB, and a second PCB, of a sub printed circuit board according to various embodiments.

FIG. 17D is a diagram illustrating various examples of a feeding unit and ground of the printed circuit board according to various embodiments.

Referring to FIG. 17A, the printed circuit board 1700 may include a first printed circuit board 1710, a second printed circuit board 1720, and an interposer 1730. For example, the first printed circuit board 1710 may be positioned on (e.g., a +Y-axis direction) the interposer 1730, and the second printed circuit board 1720 may be positioned beneath (e.g., a −Y-axis direction) the interposer 1730. The first printed circuit board 1710 may include a first fill-cut area (e.g., the first fill-cut area 1015 of FIG. 11), and the second printed circuit board 1720 may include a second fill-cut area (e.g., the second fill-cut area 1025 of FIG. 10). A plurality of connection members (e.g., the connection members 1174 and 1176 of FIG. 11) may be positioned in the first fill-cut area (e.g., the first fill-cut area of FIG. 11). In an embodiment, a ground 1740 of an antenna and a feeding unit 1750 thereof may be disposed on the first printed circuit board 1710.

Referring to FIG. 17B, the printed circuit board 1700 may include a first printed circuit board 1710, a second printed circuit board 1720, and an interposer 1730. For example, the first printed circuit board 1710 may be positioned on (e.g., a +Y-axis direction) the interposer 1730, and the second printed circuit board 1720 may be positioned beneath (e.g., a −Y-axis direction) the interposer 1730. The first printed circuit board 1710 may include a first fill-cut area (e.g., the first fill-cut area 1015 of FIG. 11), and the second printed circuit board 1720 may include a second fill-cut area (e.g., the second fill-cut area 1025 of FIG. 10). A first connection member (e.g., the connection member 1174 of FIG. 11) may be positioned in the first fill-cut area (e.g., the first fill-cut area 1015 of FIG. 11). A second connection member (e.g., the connection member 1176 of FIG. 11) may be positioned in the second fill-cut area (e.g., the second fill-cut area 1025 of FIG. 10). According to an embodiment, a feeding unit 1750 of an antenna may be disposed on the first printed circuit board 1710, and a ground 1740 of the antenna may be disposed on the second printed circuit board 1720.

Referring to FIG. 17C, the printed circuit board 1700 may include a first printed circuit board 1710, a second printed circuit board 1720, and an interposer 1730. For example, the first printed circuit board 1710 may be positioned on (e.g., a +Y-axis direction) the interposer 1730, and the second printed circuit board 1720 may be positioned beneath (e.g., a −Y-axis direction) the interposer 1730. The first printed circuit board 1710 may include a first fill-cut area (e.g., the first fill-cut area 1015 of FIG. 11), and the second printed circuit board 1720 may include a second fill-cut area (e.g., the second fill-cut area 1025 of FIG. 10). A first connection member (e.g., the connection member 1174 of FIG. 11) may be positioned in the first fill-cut area (e.g., the first fill-cut area 1015 of FIG. 11). A second connection member (e.g., the connection member 1176 of FIG. 11) may be positioned in the second fill-cut area (e.g., the second fill-cut area 1025 of FIG. 10). According to an embodiment, a ground 1740 of an antenna may be disposed on the first printed circuit board 1710, and a feeding unit 1750 of the antenna may be disposed on the second printed circuit board 1720.

Referring to FIG. 17D, the printed circuit board 1700 may include a first printed circuit board 1710, a second printed circuit board 1720, and an interposer 1730. For example, the first printed circuit board 1710 may be positioned on (e.g., a +Y-axis direction) the interposer 1730, and the second printed circuit board 1720 may be positioned beneath (e.g., a −Y-axis direction) the interposer 1730. The first printed circuit board 1710 may include a first fill-cut area (e.g., the first fill-cut area 1015 of FIG. 11), and the second printed circuit board 1720 may include a second fill-cut area (e.g., the second fill-cut area 1025 of FIG. 10). A plurality of connection members (e.g., the connection members 1174 and 1176 of FIG. 11) may be positioned in the second fill-cut area (e.g., the second fill-cut area 1025 of FIG. 11). According to an embodiment, a ground 1740 of an antenna and a feeding unit 1750 thereof may be disposed on the second printed circuit board 1720.

According to an embodiment of the present disclosure, an electronic device may form an antenna fill-cut area through an interposer of a printed circuit board, and separate antenna feeding unit and ground from a display, to improve antenna performance. In another example, the electronic device may separate a plurality of antenna feeding structures into a first printed circuit board (e.g., an upper board) and a second printed circuit board (e.g., a lower board) of the printed circuit board, to improve an isolation between the antennas.

According to an embodiment of the present disclosure, the electronic device may form a fill-cut area of a printed circuit board, and dispose components for wireless communication.

According to an embodiment of the present disclosure, the electronic device may space the antenna feeding unit and ground apart from the display, to improve the antenna performance, and may separate a plurality of antenna feeding from the printed circuit board, to improve an isolation of a plurality of antennas.

According to various embodiments of the present disclosure, the electronic device may form an antenna pattern (e.g., an antenna pattern for an RF band) in the form of an island-shaped interposer in a fill-cut area of a first printed circuit board (e.g., a lower board) of a printed circuit board, to increase the number of antennas disposed in an electronic device.

According to various embodiments of the present disclosure, the electronic device may form an antenna feeding unit on a first printed circuit board of a printed circuit board and a second printed circuit board (e.g., a lower board) thereof, to secure an isolation between antennas.

According to various embodiments of the present disclosure, the electronic device may form an antenna pattern in a fill-cut area of a first printed circuit board of a printed circuit board, to increase the number of antennas disposed in the electronic device.

An electronic device according to an example embodiment may include: a display, a side bezel including at least one conductive portion, and a printed circuit board disposed inside the side bezel. The printed circuit board may include an interposer, and a first printed circuit board and a second printed circuit board electrically connected through the interposer. The first printed circuit board may include a first fill-cut area, and the second printed circuit board may include a second fill-cut area corresponding to the first fill-cut area, and a ground or feeding unit comprising a conductive feed of an antenna using the conductive portion may be disposed at the first fill-cut area or the second fill-cut area.

The electronic device of an example embodiment may include a first connection member comprising a conductive material disposed at the first fill-cut area and electrically connected to a first conductive portion among a plurality of conductive portions of the metal frame.

According to an example embodiment, the second printed circuit board may include the second fill-cut area, and the electronic device may include a second connection member comprising a conductive material disposed at the second fill-cut area and electrically connected to a second conductive portion among a plurality of conductive portions of the metal frame.

The electronic device of an example embodiment may further include an island interposer positioned between the first fill-cut area and the second fill-cut area and coupling the first printed circuit board and the second printed circuit board.

The electronic device of an example embodiment may further include an antenna pattern positioned in the first fill-cut area, wherein the antenna pattern may be formed of an island interposer, and may be electrically connected to the metal frame through the connection member positioned in the first fill-cut area.

According to an example embodiment, the ground and feeding unit of the antenna may be disposed on the first printed circuit board.

According to an example embodiment, the feeding unit of the antenna may be disposed on the first printed circuit board, and the ground of the antenna may be disposed on the second printed circuit board.

According to an example embodiment, the ground of the antenna may be disposed on the first printed circuit board, and the feeding unit of the antenna may be disposed on the second printed circuit board.

According to an example embodiment, the ground and feeding unit of the antenna may be disposed on the second printed circuit board.

According to an example embodiment, the first printed circuit board may be disposed on the interposer and be electrically connected to the interposer, and the second printed circuit board may be disposed beneath the interposer and be electrically connected to the interposer.

According to an example embodiment, the first printed circuit board may include a first cable connector to which a first terminal of a flexible circuit board is connected, and the second printed circuit board may include a second cable connector to which a second terminal of the flexible circuit board is connected.

According to an example embodiment, the interposer may be formed in the form of a closed curve.

According to an example embodiment, the interposer may be formed in a curve form which is open at one side or two sides.

An electronic device according to an example embodiment may include: a metal frame including a plurality of conductive portions, a main printed circuit board disposed inside the metal frame, a sub printed circuit board spaced apart from the main printed circuit board, and a flexible circuit board electrically connecting the main printed circuit board and the sub printed circuit board. The sub printed circuit board may include a first interposer, and a first printed circuit board and a second printed circuit board electrically connected through the first interposer. The main printed circuit board may include a second interposer, and a third printed circuit board and a fourth printed circuit board electrically connected through the second interposer, and may connect a ground, and a feeding unit comprising a conductive feed, of a plurality of antennas through at least one of the first printed circuit board and second printed circuit board of the sub printed circuit board. The first printed circuit board may include a first fill-cut area, and the second printed circuit board may include a second fill-cut area corresponding to the first fill-cut area. The ground or feeding unit of the plurality of antennas using the conductive portion may be disposed at the first fill-cut area or the second fill-cut area.

The electronic device of an example embodiment may include a plurality of connection members comprising a conductive material disposed at the first fill-cut area and electrically connected to a first conductive portion among the plurality of conductive portions of the metal frame.

The electronic device of an example embodiment may include a plurality of connection members disposed at the second fill-cut area and electrically connected to a second conductive portion among the plurality of conductive portions of the metal frame.

The electronic device of an example embodiment may further include an antenna pattern positioned in the first fill-cut area, and the antenna pattern may be formed of an island interposer, and be electrically connected to the metal frame through the connection member positioned in the first fill-cut area.

The electronic device of an example embodiment may further include an antenna pattern positioned in the first fill-cut area, and the antenna pattern may be formed of a conductive metal material on the first printed circuit board.

According to an example embodiment, the antenna pattern may be an antenna pattern for a new radio (NR) band.

According to an example embodiment, the antenna pattern may be connected to a laser direct structuring (LDS) antenna of the electronic device.

According to an example embodiment, the first printed circuit board may be disposed on the interposer and be electrically connected to the interposer, and the second printed circuit board may be disposed beneath the interposer and be electrically connected to the interposer.

According to an example embodiment, the first interposer may be formed in the form of a closed curve.

According to an example embodiment, the first interposer may be formed in a curve form which is open at one side or two sides.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
   a side member including a first conductive portion corresponding to an antenna; and
   a first printed circuit board disposed adjacent to the first conductive portion;
   a second printed circuit board disposed adjacent to the first conductive portion;
   an interposer electrically connecting the first printed circuit board and the second printed circuit board; and
   a connection member electrically connected with the first conductive portion,
   wherein the first printed circuit board includes a first fill-cut area,
   wherein the second printed circuit board includes a second fill-cut area at least partially overlapping the first fill-cut area,
   wherein the connection member for connecting the first conductive portion to a ground of the antenna or for transmitting radio frequency (RF) signals to the first conductive portion is disposed at the first fill-cut area or the second fill-cut area, and
   wherein the first fill-cut area and the second fill-cut area are disposed adjacent to the first conductive portion.

2. The electronic device of claim 1, wherein the connection member includes a first connection member comprising a conductive material disposed at the first fill-cut area, and
   wherein the first connection member is electrically connected to the first conductive portion and configured for transmitting the RF signals to the first conductive portion.

3. The electronic device of claim 1,
   wherein the connection member includes a second connection member comprising a conductive material disposed at the second fill-cut area, and
   wherein the second connection member is electrically connected to the first conductive portion for transmitting the RF signals to the first conductive portion.

4. The electronic device of claim 1, further comprising:
   a first interposer disposed between the first fill-cut area and the second fill-cut area and electrically connecting the first printed circuit board and the second printed circuit board.

5. The electronic device of claim 4, further comprising:
   an antenna pattern separate from the antenna and disposed on the first fill-cut area; and
   a third connection member comprising a conductive material and disposed at the first fill-cut area,
   wherein the antenna pattern comprises the first interposer and is electrically connected to the side member through the third connection member.

6. The electronic device of claim 1, wherein the ground is included in the first printed circuit board, and
   wherein a radio frequency integrated circuit (RFIC) configured for transmitting the RF signals to the first conducive portion is disposed on the first printed circuit board.

7. The electronic device of claim 1, wherein a radio frequency integrated circuit (RFIC) configured for transmitting the RF signals to the first conductive portion is disposed on the first printed circuit board, and
   wherein the ground is included in the second printed circuit board.

8. The electronic device of claim 1, wherein the ground is included in the first printed circuit board, and
   wherein a radio frequency integrated circuit (RFIC) for transmitting the RF signals to the first conductive portion is disposed on the second printed circuit board.

9. The electronic device of claim 1, wherein the ground is included in the second printed circuit board, and wherein a radio frequency integrated circuit (RFIC) configured for transmitting the RF signals to the first conductive portion is disposed on the second printed circuit board.

10. The electronic device of claim 1, wherein the first printed circuit board is disposed on a first side of the interposer and is electrically connected to the interposer, and wherein the second printed circuit board is disposed on a second side of the interposer opposite to the first side of the interposer and is electrically connected to the interposer.

11. The electronic device of claim 10, further comprising:
a flexible printed circuit board,
wherein the first printed circuit board includes a first cable connector to which a first terminal of the flexible printed circuit board is connected, and
wherein the second printed circuit board includes a second cable connector to which a second terminal of the flexible printed circuit board is connected.

12. The electronic device of claim 1, wherein the interposer is formed in a form of a closed curve or in a curve form which is open at one side or two sides.

13. The electronic device of claim 1, wherein the connection member includes a third connection member comprising a conductive material, disposed at the first fill-cut area, and electrically connected to the first conductive portion for connecting the first conductive portion to the ground.

14. The electronic device of claim 1, wherein the connection member includes a fourth connection member comprising a conductive material, disposed at the second fill-cut area, and electrically connected to the first conductive portion for connecting the first conductive portion to the ground.

15. The electronic device of claim 6, wherein the first fill-cut area is disposed between the first conductive portion and the RFIC disposed on the first printed circuit board.

16. The electronic device of claim 7, wherein the first fill-cut area is disposed between the first conductive portion and the RFIC, and
wherein the second fill-cut area is disposed between the first conductive portion and the ground of the second printed circuit board.

17. The electronic device of claim 8, wherein the first fill-cut area is disposed between the first conductive portion and the ground of the first printed circuit board, and
wherein the second fill-cut area is disposed between the first conductive portion and the RFIC disposed on the second printed circuit board.

18. The electronic device of claim 9, wherein the second fill-cut area is disposed between the first conductive portion and the RFIC disposed on the second printed circuit board.

19. The electronic device of claim 1, wherein the first fill-cut area corresponds to an area in which a conductive fill of the first printed circuit board is cut, and
wherein the second fill-cut area corresponds to an area in which a conductive fill of the second printed circuit board is cut.

* * * * *